United States Patent
Hirai et al.

(10) Patent No.: US 7,645,630 B2
(45) Date of Patent: Jan. 12, 2010

(54) MANUFACTURING METHOD FOR THIN-FILM TRANSISTOR

(75) Inventors: Katsura Hirai, Hachioji (JP); Hiroshi Kita, Hachioji (JP); Hiroaki Arita, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 138 days.

(21) Appl. No.: 10/545,361

(22) PCT Filed: Feb. 17, 2004

(86) PCT No.: PCT/JP2004/001705

§ 371 (c)(1),
(2), (4) Date: Aug. 11, 2005

(87) PCT Pub. No.: WO2004/075279

PCT Pub. Date: Sep. 2, 2004

(65) Prior Publication Data

US 2006/0131561 A1     Jun. 22, 2006

(30) Foreign Application Priority Data

Feb. 18, 2003 (JP) .............................. 2003-039535

(51) Int. Cl.
*H01L 51/40* (2006.01)
(52) U.S. Cl. .......................................... 438/99
(58) Field of Classification Search .................... 257/40; 438/82, 99
See application file for complete search history.

(56) References Cited

U.S. PATENT DOCUMENTS

| | | | | |
|---|---|---|---|---|
| 3,754,986 A | * | 8/1973 | Perez-Atbuerne | ............ 430/75 |
| 5,140,398 A | * | 8/1992 | Matsuda et al. | ............... 257/53 |
| 6,159,871 A | * | 12/2000 | Loboda et al. | .............. 438/786 |
| 6,265,243 B1 | | 7/2001 | Katz et al. | |
| 6,300,988 B1 | | 10/2001 | Ishihara et al. | |
| 2001/0029103 A1 | | 10/2001 | Katz et al. | |
| 2002/0051931 A1 | * | 5/2002 | Mori et al. | ............... 430/270.1 |
| 2003/0047729 A1 | * | 3/2003 | Hirai et al. | .................... 257/40 |
| 2003/0160235 A1 | * | 8/2003 | Hirai | ........................... 257/40 |
| 2004/0129937 A1 | * | 7/2004 | Hirai | ........................... 257/40 |

FOREIGN PATENT DOCUMENTS

EP          1 041 652 A       10/2000

(Continued)

OTHER PUBLICATIONS

Machine Translation of JP 2001-244467.*

(Continued)

*Primary Examiner*—Kenneth A Parker
*Assistant Examiner*—Anthony Ho
(74) *Attorney, Agent, or Firm*—Frishauf, Holtz, Goodman & Chick, P.C.

(57) ABSTRACT

It is an object of the present invention to provide an organic thin-film transistor exhibiting high carrier mobility and a manufacturing method thereof. Disclosed is an organic thin-film transistor possessing a film having a contact angle against pure water of a surface of not less than 50°, wherein an organic semiconductor layer is formed on the film prepared by a CVD (chemical vapor deposition) method employing a reactive gas.

23 Claims, 10 Drawing Sheets

FOREIGN PATENT DOCUMENTS

| | | | |
|---|---|---|---|
| JP | 58-2032 | * | 1/1983 |
| JP | 58-2032 A | | 1/1983 |
| JP | 10-190001 A | | 7/1998 |
| JP | 2001-094107 A | | 4/2001 |
| JP | 2001-94107 A | | 4/2001 |
| JP | 2001-244467 | * | 9/2001 |
| JP | 2001-244467 A | | 9/2001 |
| JP | 2002-151508 | * | 5/2002 |
| JP | 2002-151508 A | | 5/2002 |
| JP | 2003-518755 A | | 6/2003 |

OTHER PUBLICATIONS

Machine Translation of JP 2002-151508.*

Dimitrakopoulos, et al., "Organic Thin Film Transistors for Large Area Electronics," *Advanced Materials*, Jan. 16, 2002, No. 2, p. 99-117.

Gundlach D J et al: "Improved organic thin film transistor performance using chemically modified gate dielectrics" Proceeding of the SPIE—The International Society for Optical Engineering SPIE-Int. Soc. Opt. Eng. USA, vol. 4466, 2001, pp. 54-64, XP001149892 ISSN: 0277-786X.

Lin Y Y et al: "High-mobility pentacene-based organic thin film transistors" Jun. 23, 1997, Device Research Conference Digest, 1997, $5^{TH}$ Fort Collins, Co., USA Jun. 23-25, 1997, New York, NY USA, IEEE, US, pp. 60-61, XP010239511.

* cited by examiner

MANUFACTURING METHOD FOR THIN-FILM TRANSISTOR

This application is the United States national phase application of International application PCT/JP2004/001705 filed Feb. 17, 2004.

TECHNICAL FIELD

The present invention relates to an organic thin-film transistor and a manufacturing method thereof. For more detail, the present invention relates to the organic thin-film transistor having high carrier mobility which is suited for the manufacture providing excellent productivity and reduced cost, and its manufacturing method.

BACKGROUND

With the spread of information terminals, there are increasing demands for a flat panel display that serves as a display for a computer. Further, with development of the information technology, there has been increased a chance for information offered in a form of a sheet of paper medium in the past to be offered in an electronic form. An electronic paper or a digital paper is demanded increasingly as a display medium for a mobile that is thin, lightweight and handy.

In the case of a display device of a flat sheet type, a display medium is generally formed using an element that employs a liquid crystal, organic EL or electrophoresis method. In the display medium of this kind, a technology for using an active driving element comprised of a thin-film transistor (TFT), serving as an image driving element, is the main current for ensuring uniform image brightness and an image rewriting speed.

The TFT is commonly manufactured by a process comprising forming, on a glass substrate, a semiconductor layer of a-Si (amorphous silicon) or p-Si (poly-silicon) and metal films of source, drain and gate electrodes, in order. In the manufacture of a flat panel display employing such a TFT, a photolithography step with high precision is required in addition to a thin layer forming step requiring a vacuum line carrying out a CVD method or a sputtering method or a high temperature treatment step, which results in great increase of manufacturing cost or running cost. Recent demand for a large-sized display panel further increases those costs described above.

In order to overcome the above-described defects, an organic thin-film transistor employing an organic semiconductor material has been extensively studied (Refer to Patent Document 1).

Various studies have been made to increase carrier mobility. Disclosed, for example, is a technique in which carrier mobility is increased when a silicon oxide layer is used as a gate insulating layer and its surface is subjected to treatment employing a silane coupling agent.

[Refer to "Advanced Material", 2002, No. 2, p. 99 (review)]

Disclosed also is a technique in which carrier mobility is increased by forming a film composed of a fluorine-containing polymer provided on a gate insulating layer. (Refer to Patent Document 2)

SUMMARY

The above technique for increasing carrier mobility, however, has a problem in that the treating process requires a lot of time to conduct the process of immersion in a solution, and similarly the subsequent process of washing. Specifically, in the case of utilizing a fluorine-containing silane coupling agent, the silane coupling agent incorporated into a silicon oxide layer produces the problem of spending much time for the washing process, since an acid or alcohol component is generated.

There is the underlying problem that no sufficient effect has yet been obtained via either technique to sufficiently increase carrier mobility.

Accordingly, it is an object of the present invention to provide an organic thin-film transistor exhibiting high carrier mobility and a manufacturing method thereof. Another object of the present invention is to provide an organic thin-film transistor capable of providing mass production at low cost, and its method is suitable for manufacturing via a so-called roll-to-roll process capable of serial production under non vacuum.

(Patent Document 1) Japanese Patent O.P.I. Publication No. 10-190001
(Patent Document 2) Japanese Patent O.P.I. Publication No. 2001-94107

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

BRIEF DESCRIPTION OF THE PREFERRED EMBODIMENTS

Figure 1:
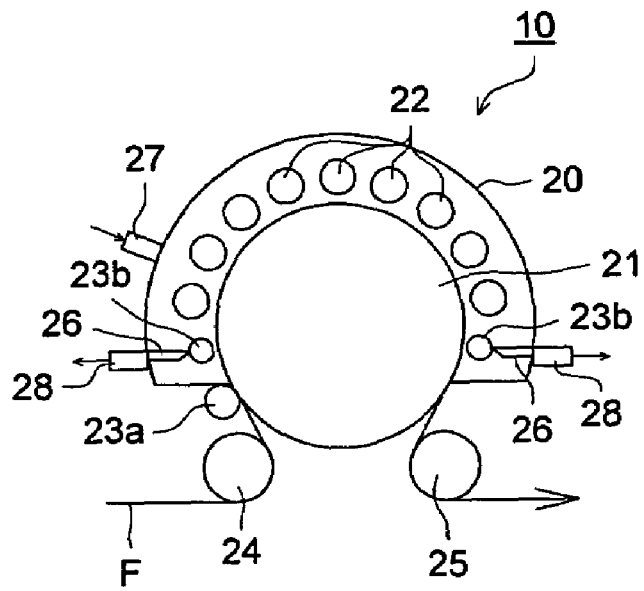
FIG. 1 is a schematic view showing an example of the plasma discharge treatment vessel.

Manufacture of the organic thin-film transistor exhibiting high carrier mobility is accomplished via serial production under non vacuum by techniques described in any one of the following structures 1-16.

(Structure 1) An organic thin-film transistor possessing a film having a contact angle against pure water of a surface of not less than 50°, wherein an organic semiconductor layer is formed on the film prepared by a CVD (chemical vapor deposition) method employing a reactive gas.

(Structure 2) The organic thin-film transistor of Structure 1, wherein the aforesaid CVD method is a plasma CVD method.

(Structure 3) The organic thin-film transistor of Structure 2, wherein the aforesaid plasma CVD method is an atmospheric pressure plasma method in which discharge-plasma is generated by applying a high frequency voltage between electrodes facing each other at atmospheric pressure or approximately atmospheric pressure.

(Structure 4) The organic thin-film transistor of any one of Structures 1-3, wherein raw material of the reactive gas contains a silicon and/or fluorine-containing organic compound.

(Structure 5) The organic thin-film transistor of any one of Structures 1-4, wherein the raw material of the reactive gas contains a silane compound having at least one alkyl group, or a titanium compound having at least one alkyl group.

(Structure 6) The organic thin-film transistor of any one of Structures 1-5, wherein the organic semiconductor layer contains a π conjugate polymer or a π conjugate oligomer.

(Structure 7) A method for manufacturing an organic thin-film transistor possessing a film having a contact angle against pure water of a surface of not less than 50°, wherein an organic semiconductor layer is formed on the film provided on a gate insulating layer after the gate electrode and the gate insulating layer are formed on a substrate surface, which is prepared by a CVD (chemical vapor deposition) method employing the reactive gas.

(Structure 8) The method for manufacturing the organic thin-film transistor of Structure 7, wherein the aforesaid CVD method is a plasma CVD method.

(Structure 9) The method for manufacturing the organic thin-film transistor of Structure 8, wherein the aforesaid plasma CVD method is an atmospheric pressure plasma method in which discharge-plasma is generated by applying a high frequency voltage between electrodes facing each other at atmospheric pressure or approximately atmospheric pressure.

(Structure 10) The method for manufacturing the organic thin-film transistor of any one of Structures 7-9, wherein the aforesaid gate insulating layer is formed by generating discharge-plasma after a high frequency voltage is applied between electrodes facing each other at atmospheric pressure or approximately atmospheric pressure, and by placing the substrate, on which the gate electrode is formed, in reactive gas excited by the plasma.

(Structure 11) The method for manufacturing the organic thin-film transistor of any one of Structures 7-10, wherein the aforesaid film is formed after the gate insulating layer is placed in the generated discharge-plasma, supplying a discharge gas, by applying a high frequency voltage between electrodes facing each other at atmospheric pressure or approximately atmospheric pressure.

(Structure 12) The method for manufacturing the organic thin-film transistor of Structure 11, wherein the aforesaid discharge gas contains oxygen.

(Structure 13) The method for manufacturing the organic thin-film transistor of any one of Structures 7-12, wherein the raw material of the reactive gas for forming a film contains a silicon and/or fluorine-containing organic compound.

(Structure 14) The method for manufacturing the organic thin-film transistor of any one of Structures 7-13, wherein the raw material of the reactive gas for forming a film contains a silane compound having at least one alkyl group, or a titanium compound having at least one alkyl group.

(Structure 15) The method for manufacturing the organic thin-film transistor of any one of Structures 7-14, wherein a process for forming an organic semiconductor layer includes a process for volatilizing a solvent in a solution after supplying the semiconducting material solution.

(Structure 16) The method for manufacturing the organic thin-film transistor of Structure 15, wherein the aforesaid semiconducting material contains a π conjugate polymer or a π conjugate oligomer.

It was found via the present invention by the inventor that a film having a contact angle against pure water of a surface of not less than 50° was prepared by the CVD (chemical vapor deposition) method employing a reactive gas in view of the idea of obtaining improved carrier mobility when the contact angle against pure water of the surface touching an organic semiconductor layer was increased, and the increased ON/OFF ratio as well as the improved carrier mobility could lead to the organic thin-film transistor preparation in a serial production process if an organic semiconductor layer touching the film was formed.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

One of the main features of the present invention is that a film having a contact angle against pure water of a surface of not less than 50° is formed by a CVD (chemical vapor deposition) method employing a reactive gas.

The film is prepared by a CVD (chemical vapor deposition) method, preferably a plasma CVD method, or more preferably an atmospheric pressure plasma method. An apparatus used for a conventional CVD method can also be utilized for these methods.

The atmospheric pressure plasma method which can be applied to the present invention will be described below.

[Plasma Discharge Treatment Apparatus]

Figure 2:
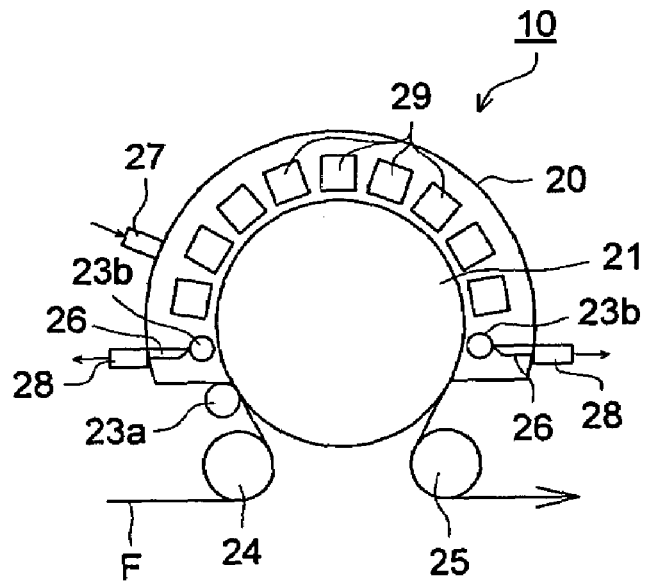
FIG. 2 is a schematic view showing another example of the plasma discharge treatment vessel.

FIG. 1 is a schematic view showing an example of plasma discharge treatment vessel 20 used for plasma discharge treatment apparatus 10. Plasma discharge treatment vessel 20 shown in FIG. 2 is utilized in another embodiment.

As shown in FIG. 1, long length film type substrate F is transported while rotating to reel it to roll electrode 21 rotating in the transporting direction (clockwise as shown in the figure). Fixed electrode 22 is composed of plural cylinders and faces roll electrode 21. Substrate F reeled to roll electrode 21, pressed by nip rollers 23a and 23b, is transported to a discharge treatment space in plasma discharge treatment vessel 20, is controlled by guide roller 24 to conduct discharge plasma treatment, and subsequently transported to the next process via guide roller 25. Partition plate 26 is placed close to the above nip roller 23b, and prevents air accompanying substrate F from entering the interior of plasma discharge treatment vessel 20.

It is preferable that air accompanying this is controlled to be not more than 1% by volume with respect to the total gaseous volume within the interior of plasma discharge treatment vessel 20. This condition is attainable by employing the aforesaid nip roller 23b.

Incidentally, a mixed gas (discharge gas and reactive gas) used for discharge plasma treatment is introduced into plasma discharge treatment vessel 20 from gas supply port 27, and gas after plasma treatment is exhausted from exhaust port 28.

FIG. 2 is a schematic view showing another example of plasma discharge treatment vessel 20 as described above. Cylinder-shaped fixed electrode 22 is used in plasma discharge treatment vessel 20 shown in FIG. 1, and rectangular fixed electrode 29 is employed in plasma discharge treatment vessel 20 shown in FIG. 2.

Rectangular fixed electrode 29 shown in FIG. 2 rather than cylinder-shaped fixed electrode 22 shown in FIG. 1 is preferably applied to the method to form a film in the present invention.

Figure 4:
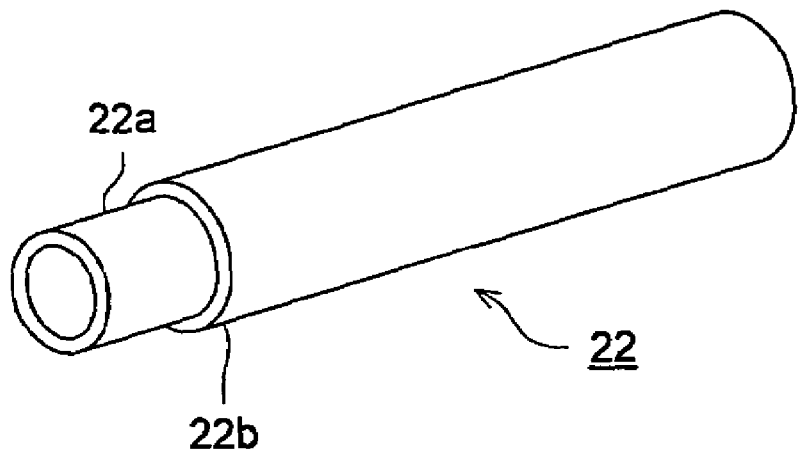
FIG. 4 is an oblique perspective view showing an example of the cylinder-shaped fixed electrode.
Figure 4:
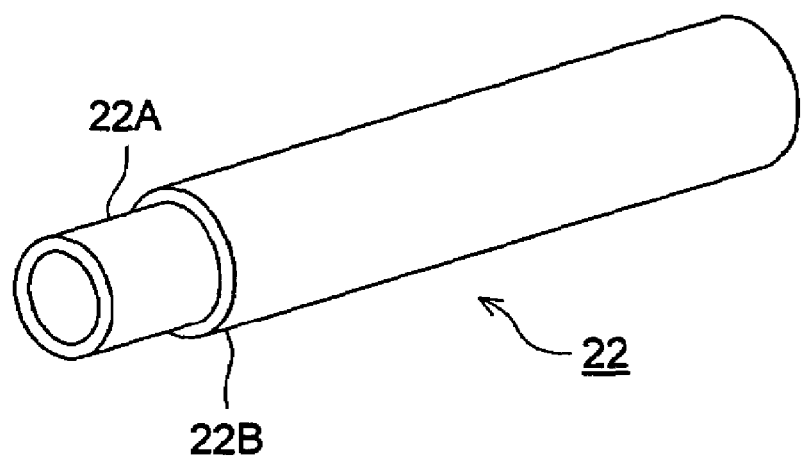
Figure 5A:
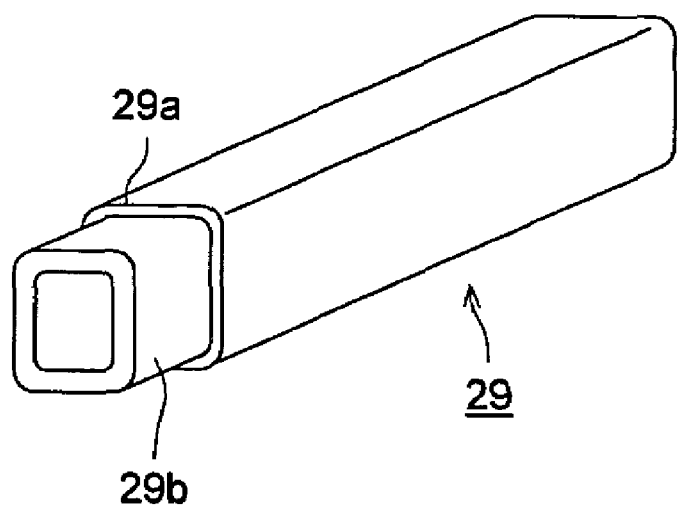
FIG. 5 is an oblique perspective view showing an example of the rectangular fixed electrode.
Figure 5B:
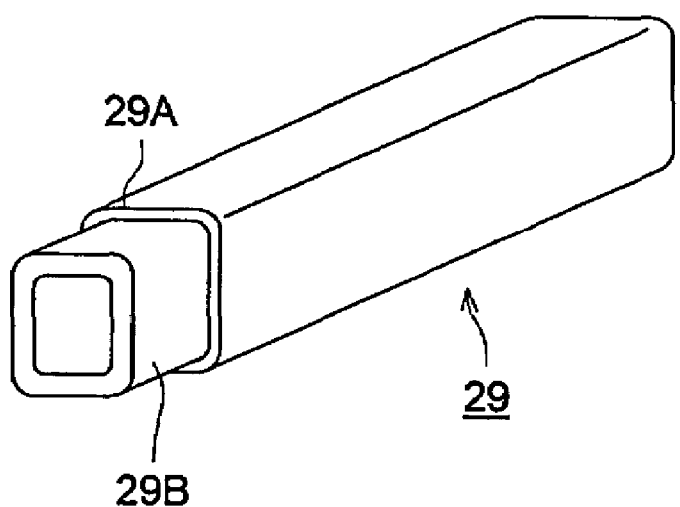

FIGS. 3(a) and 3(b) are oblique perspective views showing an example of the cylinder-shaped roll electrodes. FIGS. 4(a) and 4(b) are oblique perspective views showing an example of the cylinder-shaped fixed electrodes. FIGS. 5(a) and 5(b) are oblique perspective views showing an example of the rectangular fixed electrodes.

It is seen in FIG. 3(a) that roll electrode 21 as an electrically grounded electrode is of a combined structure, being coated by ceramic-coat-treating dielectric 21b, which is sealed by employing an inorganic material, after thermally spraying ceramic onto conductive metal base material 21a. Ceramic-coat-treating dielectric 21b is coated 1 mm thick on one side so as to have a roll diameter of 200 mm. Roll electrode 21 is used as an electrically grounded electrode.

Roll electrode 21 may also be of a combined structure being coated by ceramic-coat-treating dielectric 21B having an inorganic material provided on conductive metal base material 21A, as shown in FIG. 3(b). Preferred examples used as the lining material include silicate glass, borate glass, phosphate glass, germinate glass, tellurite glass, aluminate glass and vanadate glass, which borate glass is most preferably used, since it can be more easily processed. Though examples of conductive metal base material 21a or 21A include metals such as titanium, silver, platinum, stainless, aluminum and iron, stainless and titanium are preferably used, since it can be more easily processed. Though examples of the ceramics material employed for thermal spraying include aluminum, silicon nitride, and other materials. Of these, aluminum is preferably used, since it can be most easily processed.

Incidentally, a stainless steel jacket roll base material, having a constant temperature controlling device employing liquid, is used for conductive metal base material 21a or 21A of the roll electrode in the present embodiment (not shown in the figure).

Fixed electrode 22 or 29, as an application electrode as shown in FIGS. 4(a) and 4(b), and FIGS. 5(a) and 5(b) is of a combined structure with the aforesaid roll electrode 21.

Though the power supply applying a voltage to an application electrode is not specified, preferably employed are high frequency power supply (50 kHz) produced by Shinko Electric Co., Ltd, high frequency power supply (100 kHz in use of continuous mode) produced by Haiden Laboratory Inc, High frequency power supply (200 kHz) Pearl Kogyo Co., Ltd, high frequency power supply (800 kHz) produced by Pearl Kogyo Co., Ltd, high frequency power supply (2 MHz) Pearl Kogyo Co., Ltd, high frequency power supply (13.56 MHz) produced by Japan Electron Optics Laboratory Co., Ltd, high frequency power supply (27 MHz) Pearl Kogyo Co., Ltd, and high frequency power supply (150 MHz) produced by Pearl Kogyo Co., Ltd. Power supplies of 433 MHz, 800 MHz, 1.3 GHz, 1.5 GHz, 1.9 GHz, 2.45 GHz, 5.2 GHz, and 10 GHz in an oscillation mode may also be used.

Figure 6:
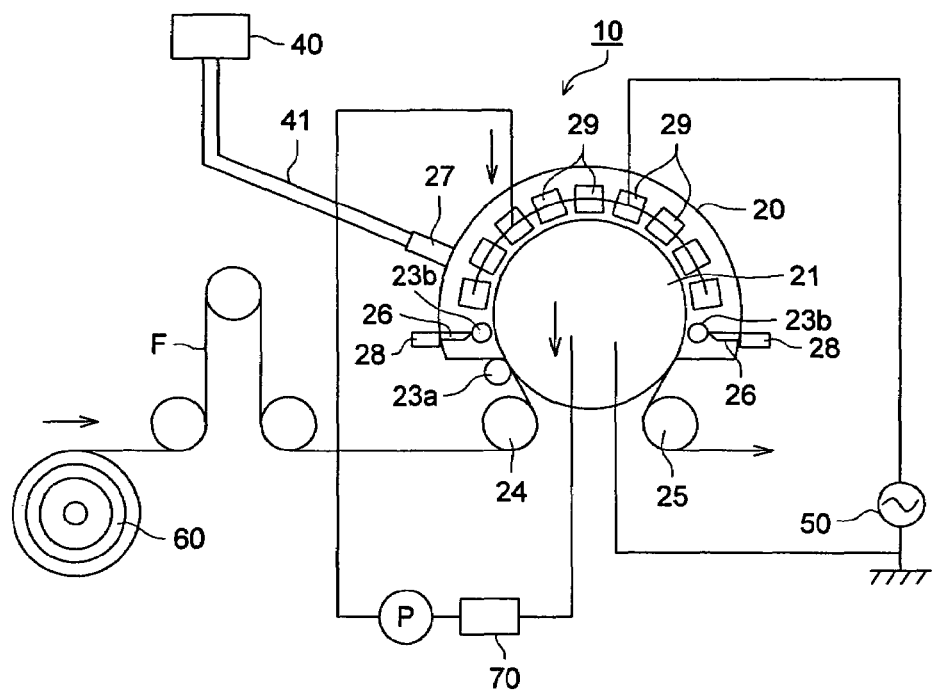
FIG. 6 is a schematic view showing an example of the plasma discharge treatment apparatus.

FIG. 6 is a schematic view showing an example of plasma discharge treatment apparatus 10.

Though plasma discharge treatment vessel 20 in FIG. 2 is the same plasma discharge treatment vessel as shown in FIG. 6, further incorporated are gas generator 40, power supply 50, electrode constant temperature unit 70 as shown in FIG. 6. Examples of the constant temperature agent for electrode constant temperature unit 70 include insulating materials such as distilled water, oil and so forth.

Figure 3:
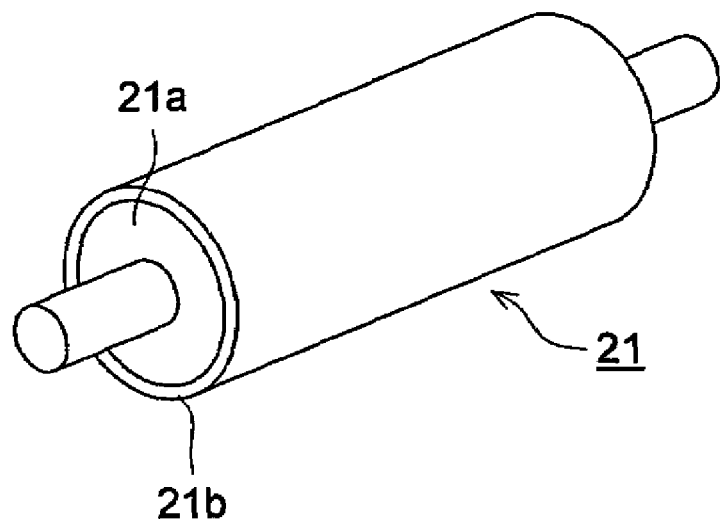
FIG. 3 is an oblique perspective view showing an example of the cylinder-shaped roll electrode.
Figure 3:
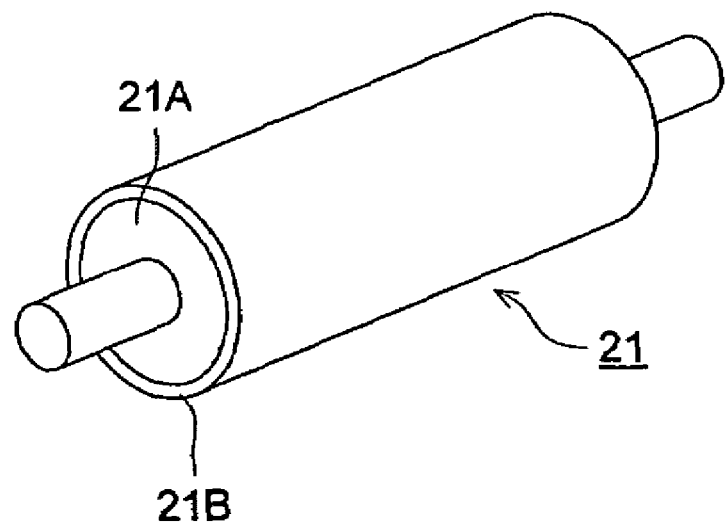

Electrodes described in FIG. 6 are the same electrodes as shown in FIG. 3 and FIG. 5. A gap between facing electrodes is, for example, set to approximately 1 mm.

The distance between electrodes is determined in consideration of the thickness of a solid dielectric material prepared onto the electrode base material, applied electric field intensity, and the purpose of the use of plasma. From the aspect of uniform discharge generation, the distance between electrodes in any case is preferably 0.5-20 mm, and more preferably 1±0.5 mm, which is the smallest gap between the electrode and the solid dielectric material, in the case of providing a solid dielectric material on one side of the above electrode, or the shortest distance between the solid dielectric materials, in the case of providing a solid dielectric material on both sides of the above electrode.

Roll electrode 21 and fixed electrode 29 are placed at a prescribed position in the foregoing plasma discharge treatment vessel 20, the flow rate of the mixed gas generated by gas generator 40 is controlled, the mixed gas is introduced into plasma discharge treatment vessel 20 from gas supply port 27 via gas charging means 41, and is exhausted from exhaust port 28 after the interior of the above plasma discharge treatment vessel 20 is charged by the mixed gas employing for plasma treatment. Subsequently, voltage is applied to electrodes via power supply 50, electrically grounded roll electrode 21, and thereby discharge plasma is generated. Substrate F is supplied from stock roll substrate 60, and is transported between electrodes in plasma discharge treatment vessel 20, while touching one surface of the substrate (by touching roll electrode 21). Substrate F is transported to the next process via guide roller 25 after a film is prepared on the surface of substrate F via discharge plasma while transporting substrate F, and a film containing an inorganic compound originated from reactive gas in the mixed gas is formed on the surface of substrate F. The film is deposited only on the surface of substrate F which does not touch roll electrode 21.

Though voltage applied to fixed electrode 29 via power supply 50 is appropriately determined, voltage and power supply frequency, for example, are adjusted to be approximately 0.5-10 kV and 1 kHz-150 MHz, respectively. Herein, as a power supply method, either a continuous oscillation mode (also known as a continuous mode) with a continuous sine wave or a discontinuous oscillation mode (also known as a pulse mode) switching ON/OFF continuously, may be used.

Though discharge power depends on the apparatus configuration, discharge power density may preferably be 0.1-50 W/cm².

Next, will be to be described an atmospheric pressure plasma discharge method and its apparatus, in which high frequency voltage having two frequencies is applied. Discharge condition in the present invention is such that a high frequency voltage is applied across a discharge space formed between a first electrode and a second electrode facing each other, wherein the high frequency voltage possesses at least one voltage component in which a voltage with first frequency $\omega_1$ and a voltage with second frequency $\omega_2$, being higher than first frequency $\omega_1$ are superposed.

The high frequency herein referred to implies a frequency of at least 0.5 kHz.

The above high frequency voltage possesses a voltage component in which a voltage with first frequency $\omega_1$ and a voltage with second frequency $\omega_2$ higher than the first frequency $\omega_1$ are superposed and the waveform is a jagged waveform in which a sine wave of the voltage with frequency $\omega_1$ is superposed on a sine wave of the voltage with frequency $\omega_2$ higher than frequency $\omega_1$.

In the present invention, discharge starting voltage refers to a lowest voltage necessary to induce discharge at a discharge space condition (constitution of electrodes, etc.) or reaction condition (condition of gases, etc.) used in the layer formation method. The discharge starting voltage slightly varies depending on kinds of gases supplied to the discharge space or kinds of dielectrics of electrodes. However, the discharge starting voltage may be regarded as substantially the same as that determined by discharge gases alone.

Such application of the high frequency voltage as described above across a discharge space between the opposed electrodes is considered to be able to induce discharge capable of forming a layer to generate plasma with high density necessary to form a layer with high quality. It is important here that a high frequency voltage is applied to each of the electrodes facing each other, i.e., the voltage is applied to the same discharge space through both of the electrodes facing each other. The high frequency voltage application method is not capable of forming the layer in the present invention, in which a first discharge space between two electrodes facing each other and a second discharge space between another two electrodes facing each other are separately formed, and a high frequency voltage with different frequencies is applied to each of the first and second spaces.

In the above, superposing of the two sine waves is described, but the present invention is not limited thereto. Two waves may be pulse waves, or one of the two waves may be a sine wave and the other a pulse wave. The wave may further contain a third voltage component.

An embodiment for application of high frequency voltage across a discharge space between the electrodes facing each other is to use an atmospheric pressure plasma discharge treatment apparatus in which a first electrode of the electrodes facing each other is connected to a first power supply applying a first high frequency voltage of voltage $V_1$ with frequency $\omega_1$, and a second electrode of the electrodes facing each other is connected to a second power supply applying a second high frequency voltage of voltage $V_2$ with frequency $\omega_2$.

The atmospheric pressure plasma discharge treatment apparatus has a gas supply means for supplying the discharge gas and layer formation gas to the discharge space between the electrodes facing each other. The apparatus preferably possesses an electrode temperature control means for controlling the electrode temperature.

It is preferred that a first filter is connected to the electrode or the first power supply or is provided between them, and a second filter is connected to the electrode or the second power supply or is provided between them. The first filter has a function in which current from the first power supply is difficult to flow and current from the second power supply is easy to flow. The second filter has a function in which current from the second power supply is difficult to flow and current from the first power supply is easy to flow. Herein, "current is difficult to flow" means that current of up to 20%, and preferably up to 10% of the current supplied flows, and "current is easy to flow" means that current of not less than 80%, and preferably not less than 90% of the current supplied flows.

In the atmospheric pressure plasma discharge treatment apparatus, it is preferred that the first power supply has a function capable of supplying a high frequency voltage higher than the second power supply.

In the present invention when a high frequency voltage is applied across the first and second electrodes, it is preferred that the high frequency voltage is a combined voltage of a first high frequency voltage $V_1$ and a second high frequency voltage $V_2$, and the first high frequency voltage $V_1$, the second high frequency voltage $V_2$, and discharge starting voltage IV satisfy relationship $V_1 \geqq IV > V_2$ or $V_1 > IV \geqq V_2$, and preferably relationship $V_1 > IV > V_2$.

The definition of high frequency or discharge starting voltage or a method for applying the high frequency voltage across the discharge space between the electrodes facing each other is as described above.

The high frequency voltage (applied voltage) or the discharge starting voltage referred to in the present invention is measured according to the following method.

Measuring method of high frequency voltage $V_1$ or $V_2$ (kV/mm): High frequency probe (P6015A) is connected to each electrode and also to oscilloscope TDS 3012B (produced by Techtronix Co., Ltd.) to measure voltage.

Measuring method of discharge starting voltage IV (kV/mm): Discharge gas is supplied to a discharge space between the electrodes, and when voltage applied to the electrodes is increased, voltage at which discharge starts is defined as discharge starting voltage IV. The measuring device is the same as described above.

A gas with high discharge starting voltage such as a nitrogen gas starts discharge, by application of high voltage, and stable plasma with high density is maintained, which can form a layer with high performance.

When discharge gas is a nitrogen gas, its discharge starting voltage IV is approximately 3.7 kV/mm, and the nitrogen gas can be excited by application of a first high frequency voltage $V_1$ of not less than 3.7 kV/mm to be in plasma state.

The frequency of the first power supply is preferably not more than 200 kHz. The electric field waveform may be a pulse wave or a sine wave. The lower limit of the frequency is preferably about 1 kHz.

The frequency of the second power supply is preferably not less than 800 kHz. As the frequency of the second power supply is higher, plasma density is higher, resulting a layer with higher quality. The upper limit of the frequency is preferably about 200 MHz.

The application of high frequency voltage from two power supplies as described above is important in the invention. That is, it is important in the present invention that voltage with the first frequency $\omega_1$ starts discharge of a discharge gas having a high discharge starting voltage, and voltage with the first frequency $\omega_2$ increases plasma density to obtain a layer with high density and high quality.

In the present invention, the first filter has a function that current from the first power supply is difficult to flow and current from the second power supply is easy to flow. The second filter has a function in which current from the second power supply is difficult to flow and current from the first power supply is easy to flow. In the present invention, the filter having the function described above can be used with no limitation.

As the first filter, a capacitor of from several tens of pF to tens of thousands of pF or a coil with several µH can be used according to the frequency of the second power supply. As the second filter, a coil of not less than 10 µH can be used according to the frequency of the first power supply. The coil is connected to the capacitor and one terminal of the connected is connected to the power supply and another terminal thereof is electrically grounded whereby the filter is formed.

The first and the second power supplies are not necessarily employed at the same time, and each of them can be used singly. In this case, the same effect as in the case of high frequency power supply with a single frequency applied can be obtained.

As one embodiment of the atmospheric pressure plasma treatment apparatus of the present invention, there is the apparatus as described above in which a discharge gas and a layer formation gas supplied to a discharge space between two electrodes facing each other is excited in plasma state by discharge, and a substrate moving or standing still at the space is exposed to the plasma to form a layer on the substrate (Refer to FIG. 1-FIG. 7, for example). As another embodiment of the atmospheric pressure plasma treatment apparatus of the present invention, there is an apparatus employing a jet process in which gas supplied to a discharge space between two electrodes facing each other is excited in plasma state by discharge, the resulting plasma is jetted outside the discharge space, and a substrate (which may move or stand still) at the vicinity of the electrodes is exposed to the jetted plasma to form a layer on the substrate (Refer to FIG. 8 described later).

As another embodiment shown in FIG. 9 described later, discharge gas G is introduced into discharge space formed by two sets of electrodes facing each other 211-221 and 212-222 and is exited, and then a film can be formed on substrate F by bringing the excited discharge gas G' into contact with a layer formation gas (reactive gas) M containing a material for forming a layer to mix.

Plasma discharge treatment vessel 20 is preferably a vessel made of pyrex (R) glass, but a vessel made of metal may be used if insulation from the electrodes is secured. For example, the vessel may be a vessel made of aluminum or stainless steel laminated with a polyimide resin or a vessel made of the metal which is thermally sprayed with ceramic to form an insulation layer on the surface.

It is preferable that the substrate temperature is adjusted to be at more than room temperature (15-25° C.) and at less than 300° C. in order to minimize the impact on the substrate at the time of discharge plasma treatment, or more preferably at room temperature –200° C. This temperature range is not to be limited, provided that the upper limit of temperature is determined under the conditions of the above temperature depending on the substrate property and specifically glass transition temperature. For arranging the above range of temperature to be adjusted, the electrodes and the substrate are subjected to discharge plasma treatment while cooling by a cooling device if desired.

Though the above discharge plasma treatment is carried out at atmospheric pressure or approximately atmospheric pressure in the present invention, it may be conducted in vacuum or at high pressure. Atmospheric pressure or approximately atmospheric pressure herein referred to implies a pressure of 20 kPa to 110 kPa. In order to obtain the effects as described in the invention, the above pressure is preferably 93 kPa to 104 kPa.

In the electrode used for discharging in the atmospheric plasma treatment, the surface of the electrode on the side contacting a substrate preferably has a maximum surface roughness Rmax (defined according to JIS B 0601) of not more than 10 μm. The maximum surface roughness Rmax is more preferably not more than 8 μm.

Figure 7:
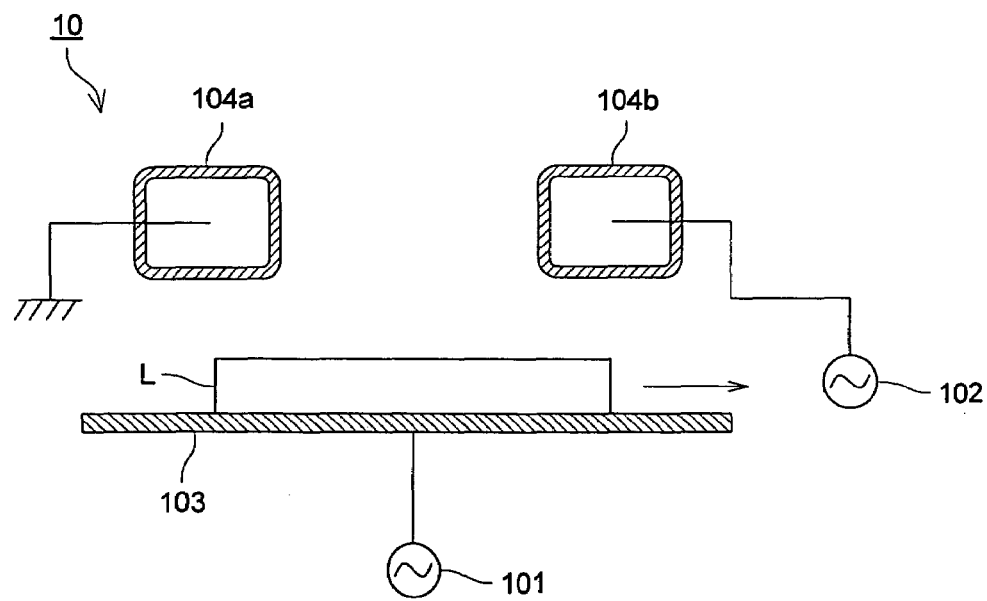
FIG. 7 is a schematic view showing another example of the plasma discharge treatment apparatus.

Incidentally, plasma discharge treatment apparatus 10 in FIG. 1 and FIG. 2 described above is an apparatus used when substrate F is a film. Plasma discharge treatment apparatus 10 as shown in FIG. 7, however, is used in the case of a substrate thicker than a film such lenses, for example. FIG. 7 is a schematic view showing another example of the plasma discharge treatment apparatus.

Plate electrode 103 is used for an electrode connected high frequency power supply 101 in this plasma discharge treatment apparatus 10, and the substrate (lens L, for example) is placed on plate electrode 103.

On the one hand, bar type cylinder-shaped electrode 104b as an electrode connected to low frequency power supply 102, situated on electrode 103 is placed so as to face to electrode 103. Bar type cylinder-shaped electrode 104a is connected to ground. In this case, a mixed gas is introduced from the upper portion of 104a and 104b, and plasma is generated in the region from the space between 104a and 104b to the space around electrode 103.

Figure 8:
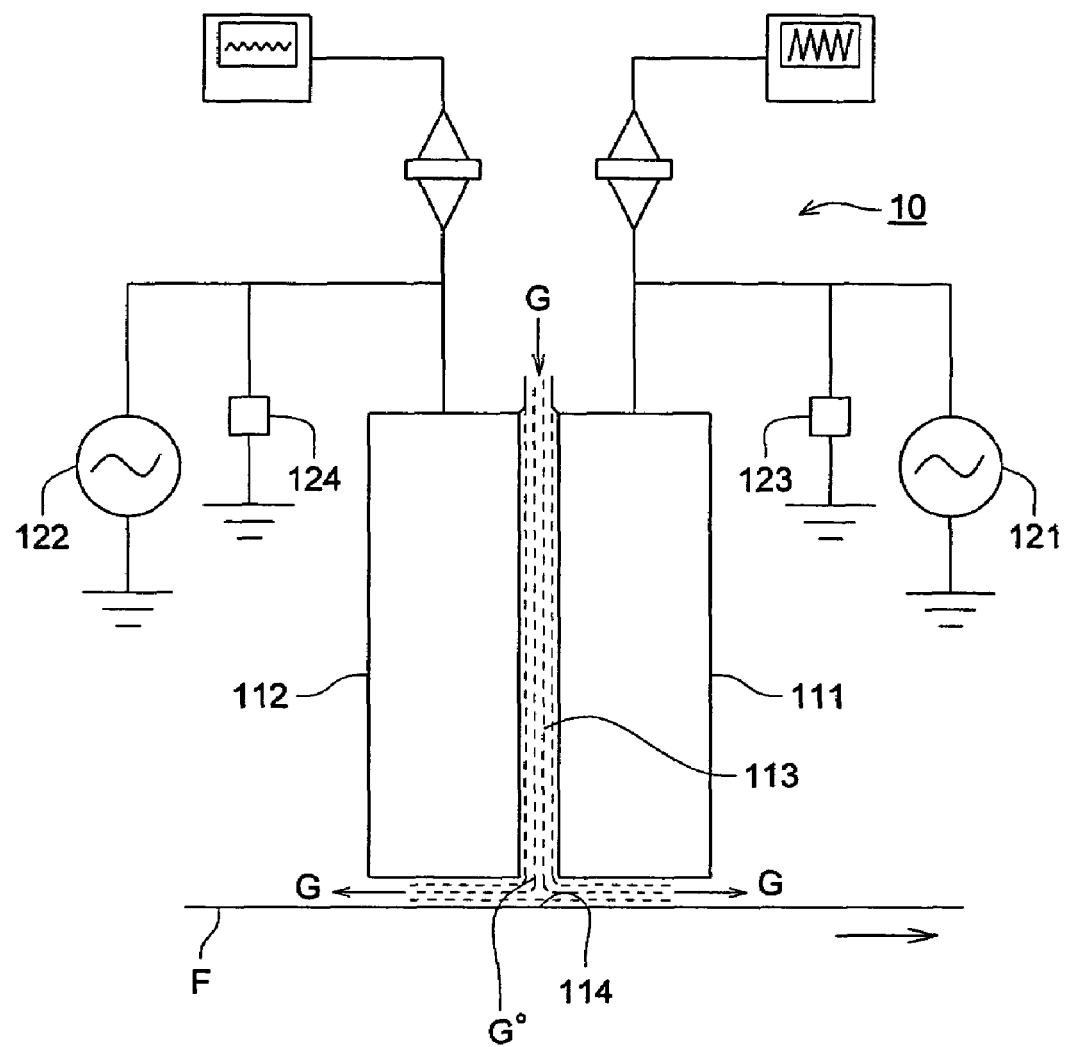
FIG. 8 is a schematic view showing an example of the atmospheric pressure plasma discharge treatment apparatus.

FIG. 8 is a schematic view showing an example of the atmospheric pressure plasma discharge treatment apparatus utilized in the present invention.

Plasma discharge treatment apparatus 10 possesses first electrode 111 and second electrode 112 facing each other, in which a first high frequency voltage $V_1$ with first frequency $\omega_1$ is applied to first electrode 111 from first power supply 121, and second high frequency voltage $V_2$ with second frequency $\omega_2$ is applied to the second electrode 112 from second power supply 122. It is sufficient if first power supply 121 has the ability capable of supplying a high frequency voltage ($V_1 > V_2$) higher than that of second power supply 122. Further, it is sufficient if first frequency $\omega_1$ of first power supply 121 has the ability to supply a frequency lower than second frequency $\omega_2$ of second power supply 122.

First filter 123 is provided between first electrode 111 and first power supply 121 so that current flows from first power supply 121 to first electrode 111, which is designed so that the current from first power supply 121 is difficult to flow and current from second power supply 122 is easy to flow.

Second filter 124 is provided between second electrode 112 and second power supply 122 so that current flows from second power supply 122 to second electrode 112, which is designed so that the current from second power supply 122 is difficult to flow and current from first power supply 121 is easy to flow.

Gas G is introduced into discharge space 113 between first electrode 111 and second electrode 112 through a gas supply means, a high frequency voltage is applied to electrodes 111 and 112 to induce discharge and generate gas in a plasma state, the gas in a plasma state is jetted under the electrodes and the treatment space formed between the lower surface of the electrodes and substrate F is charged with gas G° in a plasma state to treat at treating position 114 to form a layer on substrate F.

Figure 9:
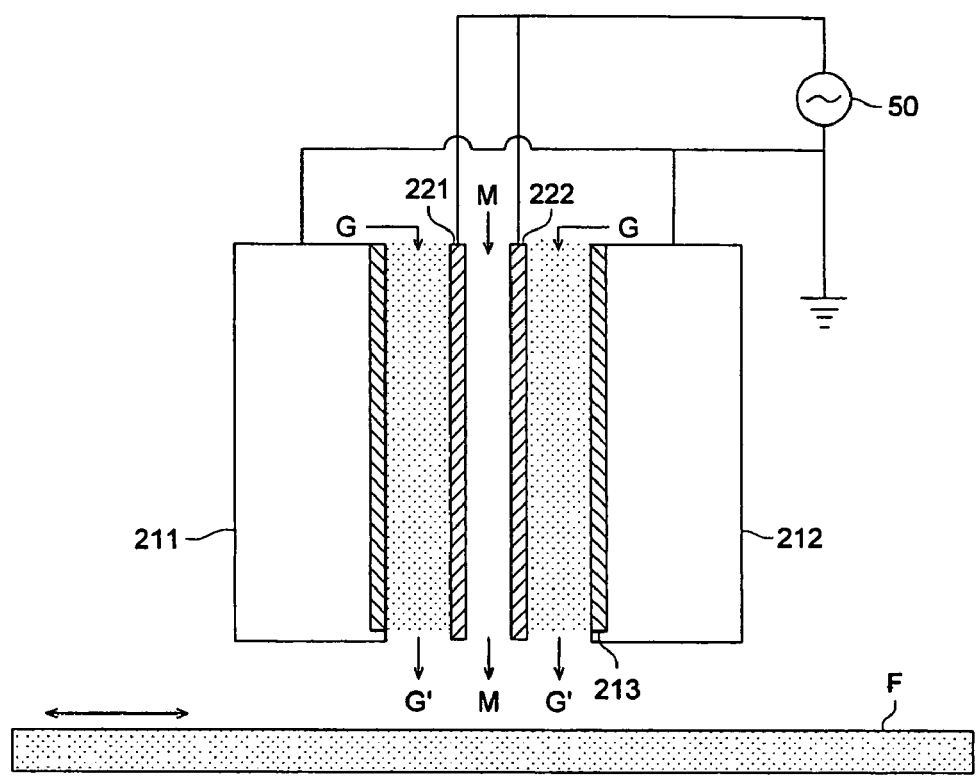
FIG. 9 is a schematic view showing another example of the atmospheric pressure plasma discharge treatment apparatus.

FIG. 9 is a schematic view showing another example of the atmospheric pressure plasma discharge treatment apparatus utilized in the present invention.

The atmospheric pressure plasma discharge treatment apparatus in the figure is mainly composed of electrodes such as first and second electrodes 211 and 221, and also 212 and 222 facing each other, high frequency power supply 50 as a voltage application means in which a high frequency electric field is applied between electrodes facing each other, a gas supply means by which discharge gas G is introduced into discharge space, and reactive gas (layer formation gas)M is also introduced into the exterior of discharge space, though a figure is not shown, an electrode temperature control means to control the foregoing electrode temperature, and so forth.

There is discharge space which is the region having dielectric 213 on the first electrode indicated with diagonal lines, between first and second electrodes 211 and 221, or first and second electrodes 212 and 222. Discharge gas G introduced into this discharge space is excited. There is no discharge generated in the region between second electrodes 221 and 222, and layer formation gas M is introduced into this region. Excited discharge gas G' is subsequently brought into contact with layer formation gas M in the region outside the discharge space between electrodes facing each other to generate an indirect excited gas, and a layer is formed by exposing the surface of substrate F to the indirect excited gas.

Though a figure is shown here so as to apply the high frequency voltage having a single frequency, the high frequency electric field having two frequencies may be applied employing the foregoing method.

[Formation of Film]

A gas employed depends on kinds of films designed to be formed on a substrate, but is basically a mixed gas of a discharge gas (inert gas) and reactive gas for forming a layer. The content of reactive gas in the mixed gas is preferably 0.01-10% by volume, more preferably 0.1-10% by volume, and still more preferably 0.1-5% by volume.

Examples mainly of the 18$^{th}$ family element in the periodic table include the above inert gas such as He, Ne, Ar, Kr, Xe or Rn, and nitrogen gas. He, Ar, or Nitrogen gas is preferably used to realize effect of the present invention.

The content of these gases such as oxygen, ozone, hydrogen peroxide, carbon dioxide, carbon monoxide, hydrogen, and nitrogen is contained in the mixed gas to be 0.01 to 5% by volume to control reaction and to form a high quality layer.

Any state of gas, liquid, and solid at room temperature and atmospheric pressure can be accepted when raw material of reactive gas is introduced into discharge space between electrodes. In the case of gas, the gas is introduced into discharge space as it is. But, in the case of liquid and solid, they are vaporized by means of heating, reduced pressure and emission of ultrasonic waves to be used.

Compounds used for reactive gas of forming a layer in the present invention will be described.

It is specifically effective in the present invention to have an alkyl group on the outermost surface of a film for forming a film. Either a fluoroalkyl group or an alkyl group consisting of carbons and hydrogens may be accepted as the alkyl group. Usually, the alkyl group has a carbon number between 1 and 40, preferably between 1 and 20. An organosilicon compound containing both a hydrolysis group and an alkyl group is more preferably used.

Herein, a hydrolysis group means a functional group capable of being polymerized by adding water and hydrogen. The present invention is not limited thereto, but an alkoxy group and an acetyl group are preferably provided. An alkoxy is more preferably provided. It is still more preferable to contain an ethoxy group for reactivity and the raw material property.

In addition to the foregoing organosilicon compound, an organometallic compound containing a metallic element such as Ti, Ge, Zn or Sn, and a fluorine-containing compound are preferably provided. Especially preferably provided are an organosilicon compound, a Ti-containing compound and a fluorine-containing compound.

Compounds which are shown in following general formula (1) are preferable.

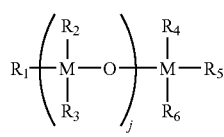

General formula (1)

M represents Si, Ti, Ge, Zr, or Sn in general formula (1). $R_1$-$R_6$ represent a hydrogen atom or a monovalence group respectively and at least one group among groups represented by $R_1$-$R_6$ is an organic group with fluorine atoms. The organic groups which contain alkyl group, alkenyl group, or aryl group which possess fluorine atoms should be used. Trifluoromethyl group, perfluoroethyl group, perfluoropropyl group, perfluorobutyl, 4,4,3,3,2,2,.1,1-octafluorobutyl group as an aryl group with fluorine atoms, for example, can be provided. 3,3,3-trifluoro-1-propenyl group as an alkenyl group with fluorine atoms, for example, can be provided. Pentafluorophenyl group as an aryl group with fluorine atoms, for example, can also be provided. Alkoxy group, alkenyloxy group, and aryloxy group made from alkyl group, alkenyl group, and aryl group with fluorine atoms respectively can be employed.

An arbitrary number of fluorine atoms in an alkyl group, an alkenyl group, and an aryl group may be bonded at any bonding position of a carbon atom in a skeleton. But, at least one or more fluorine atoms should be bonded. Carbon atoms in skeletons of an alkyl group and an alkenyl group, for example, may also be substituted by other atoms of oxygen, nitrogen, sulfur and others and also by divalent groups including oxygen, nitrogen, and sulfur, for example, a carbonyl group, a thiocarbonyl group, and so forth.

A hydrogen atom or a monovalent group other than organic groups with fluorine atoms can be represented in the group shown by $R_1$-$R_6$. Hydroxy group, amino group, isocyanate group, halogen group, alkyl group, cycloalkyl group, alkenyl group, aryl group, alkoxy group, alkenyloxy group, aryloxy group, and so forth as a monovalent group, for example, can be given. But, those are not limited. The symbol j is represented by an integer which can be 0 to 150 and an integer of 0 to 50 is preferably used. An integer of 0 to 20 is especially preferable.

A chlorine atom, a bromine atom, and an iodine atom in the aforementioned monovalent group are preferable as a halogen atom. Alkoxy group, alkenyloxy group, and aryloxy group among those groups such as alkyl group, alkenyl group, aryl group, alkoxy group, alkenyloxy group, and aryloxy group as the monovalent group, mentioned above, are preferably used.

Si and Ti among metallic atoms, which are represented by M, are preferably used.

The aforementioned monovalent group may be substituted by other groups though they are not especially specified and preferable substitution groups include amino group, hydroxyl group, isocyanate group, halogen atoms such as fluorine atom, chlorine atom, bromine atom and so forth, and groups such as alkyl group, cycloalkyl group, alkenyl group, aryl group such as phenyl group and so forth, alkoxy group, alkenyloxy group, aryloxy group, acyl group, acyloxy group, alkoxycarbonyl group, alkaneamido group, arylamido group, alkylcarbonmoyl group, arylcarbamoyl group, silyl group, alkylsilyl group, alkoxysilyl group, and so forth.

The aforementioned organic group with fluorine atoms or other groups represented by $R_1$-$R_6$ may be of the structure which contains a plurality of metallic atoms substituted by the group which is represented by $R^1R^2R^3M$-. (M represents the aforementioned metallic atom. $R^1$, $R^2$, and $R^3$ represent a monovalent group respectively. The aforementioned organic group with fluorine atoms or a group other than the aforementioned organic group with fluorine atoms which is represented by $R_1$-$R_6$ is given as a monovalent group.) Si and Ti as those metallic atoms are given and for example, silyl group, alkylsilyl group, alkoxysilyl group, and so forth can be given.

Groups with fluorine atoms represented by $R_1$-$R_6$ which are an alkyl group and an alkenyl group or an alkyl group and an alkenyl group based on an Alkoxy group and an alkenyloxy group which can be formed by those groups with fluorine atoms are preferable to be shown in general formula (F).

Rf-X—$(CH_2)_k$— <span></span> General Formula (F)

Rf in general formula (F) represents an alkyl group and an alkenyl group in which at least one hydrogen atom is substituted by fluorine atoms and for examples, those groups, mentioned below, are preferable.

Perfluoroalkyl group and so forth such as trifluoromethyl group, pentafluoroethyl group, perfluorooctyl group, and heptafluoropropyl group, 3,3,3-trifluoropropyl group, and 4,4,3,3,2,2,1,1-octafluorobutyl group and alkenyl group substituted by fluorine atoms such as 1,1,1-trifluoro-2-chlorpropenyl group and so forth. Groups such as trifluoromethyl group, pentafluoroethyl group, perfluorooctyl group, heptafluoropropyl group and alkyl group possessing at least two or more fluorine atoms such as 3,3,3-trifluoropropyl group, 4,4,3,3,2,2,1,1 octafluorobutyl group and so forth are especially preferable.

X is either a single bond or a divalent group. There are —O—, —S—, groups such as —NR—(R represents a hydrogen atom or an alkyl group.), and so forth and also groups of —CO—, —CO—O—, —CONH—, —$SO_2$NH—, —$SO_2$—O—, and —OCONH—, and so forth which represent divalent groups.

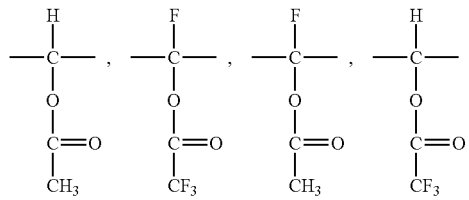

Symbol k is an integer of 0 to 50. But, an integer of 0 to 30 is preferably used.

Substitution groups other than fluorine atoms for Rf may be substituted and groups which are similar to those exemplified as substitution groups for the aforementioned $R_1$-$R_6$ can be given. Skeleton carbon atoms in Rf may be partially substituted by, for examples, groups of other atoms such as —O—, —S—, —$NR_0$— ($R_0$ represents a hydrogen atom or an alkyl group which is either substituted or not and may also be a group expressed in general formula (F).), carbonyl group, —NHCO—, —CO—O—, —$SO_2$NH—, and so forth.

Compounds which are hereinafter expressed in general formula (2) among those expressed by aforementioned general formula (1) are preferable.

[Rf-X—$(CH_2)_k]_q$-M$(R_{10})_r(OR_{11})_t$ <span></span> General formula (2)

M in general formula (2) represents the same metallic atom as in aforementioned general formula (1). Rf and X in general formula (2) represent the same groups as expressed in general formula (F) and the same integer represented by k is also applied. $R_{10}$ represents an alkyl group or an alkenyl group and also $R_{11}$ represents an alkyl group, an alkenyl group, or an aryl group. Preferably those groups represent an alkyl group and an alkenyl group which are not substituted though they may be substituted by the same groups as those provided as substitution groups of $R_1$-$R_6$ in aforementioned general formula (1), and q+r+t=4, q≧1, and t≧1 are also satisfied respectively. A linkage ring of $R_{10}$ and $R_{10}$ may be formed in the case of r≧2.

Compounds which are expressed in general formula (3) described later among those expressed in general formula (2) are preferable.

Rf-X—$(CH_2)_k$-M$(OR_{12})_3$ <span></span> General formula (3)

Rf, X, and k are used synonymously with those in aforementioned general formula (2). $R_{12}$ is also used synonymously with $R_{11}$ in general formula (2). M is also the same M as appeared in general formula (2). Si and Ti as M are preferably used. Especially Si is preferably used.

Compounds which are shown in general formula (4) described later are given as another preferable example of organometallic compounds possessing fluorine atoms in the present invention.

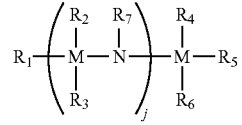
General formula (4)

Herein, M and $R_1$-R6 are used synonymously with $R_1$-$R_6$ in aforementioned general formula (1). At least one of $R_1$-$R_6$ is an organic group with fluorine atoms and a group expressed by aforementioned general formula (F) is preferable. $R_7$ represents a hydrogen atom or an alkyl group which is either substituted or not. The symbol j represents an integer which can be 0 to 100 and an integer of 0 to 50 is preferably used. An integer of 0 to 20 is especially preferable.

Organometallic compounds containing fluorine atoms which are expressed in general formula (5) described later are given as other preferable compounds containing fluorine atoms which are employed in the present invention.

[Rf-X—$(CH_2)_k$Y]$_m$-M$(R_8)_n(OR_9)_p$ <span></span> General formula (5)

M represents In, Al, Sb, Y or La in general formula (5). Rf and X represent the same groups of Rf and X as appeared in aforementioned general formula (F) and Y is either a single bond or an oxygen atom. The symbol k is similarly an integer of 0 to 50 and an integer not more than 30 is preferable. $R_9$ represents an alkyl group or an alkenyl group and also $R_8$ represents an alkyl group, an alkenyl group, or an aryl group. They may be substituted by the same groups as those provided as substitution groups of $R_1$-$R_6$ in aforementioned general formula (1). In general formula (5), the following conditions are shown. m+n+p=3 holds, and m is at least 1, n represents integers of 0-2 and p also represents integers of 0-2. The condition of m+p=3, namely of n=0 is preferable.

Organometallic compounds containing fluorine atoms which are expressed in general formula (6) described later are provided as other preferable compounds containing fluorine atoms which are employed in the present invention.

$R^{f1}(OC_3F_6)_{ml}$—O—$(CF_2)_{nl}$—$(CH_2)_{pl}$-Z-$(CH_2)_{ql}$—
Si—$(R^2)_3$ <span></span> General formula (6)

As for general formula (6), $R^{f1}$ represents a straight chain or a branched chain perfluoroalkyl group having a carbon number between 1 and 16, $R^2$ represents a hydrolysis group, and Z represents either —OCONH— or —O—. The symbol ml represents an integer between 1 and 50, nl represents an integer between 0 and 3, pl represents an integer between 0 and 3, ql represents an integer between 1 and 6, and 6≧nl+pl>0 holds.

A carbon number of a straight chain or a branched chain perfluoroalkyl group which can be introduced into $R^{f1}$ should be 1-16. The number 1-3 is especially preferable. Accordingly, —$CF_3$, —$C_2F_5$, —$C_3F_7$, and so forth as $R_{f1}$ are preferably used.

—Cl, —Br, —I, —$OR^{11}$, —$OCOR^{11}$, —$CO(R^{11})C$=C$(R^{12})_2$, —ON=C$(R^{11})_2$, —ON=$CR^{13}$, —N$(R^{12})_2$, —$R^{12}NOCR^{11}$, and so forth as hydrolysis groups which can be introduced to $R^2$ are preferably used. $R^{11}$ represents an aliphatic hydrocarbon group having a carbon number between 1 and 10 such as an alkyl group and so forth or an aromatic hydrocarbon group having a carbon number between 6 and 20 such as a phenyl group and so forth, $R^{12}$ represents an aliphatic hydrocarbon group having a carbon number between 1 and 5 such as a hydrogen atom or an alkyl group and so forth, and $R^{13}$ represents a divalent aliphatic hydrocarbon group having a carbon number between 3 and 6 such as an alkylidene group and so forth. —$OCH_3$, —$OC_2H_5$, —$OC_3H_7$, —$OCOCH_3$, and —$NH_2$ among those hydrolysis groups are preferably used.

The suffix ml is preferably 1-30, and more preferably 5-20. The suffix nl is more preferably either 1 or 2, pl is also more preferably either 1 or 2, and ql is also more preferably 1-3.

Organometallic compounds containing fluorine atoms which are expressed in general formula (7) described later are given as other preferable compounds containing fluorine atoms which are employed in the present invention.

General formula (7)

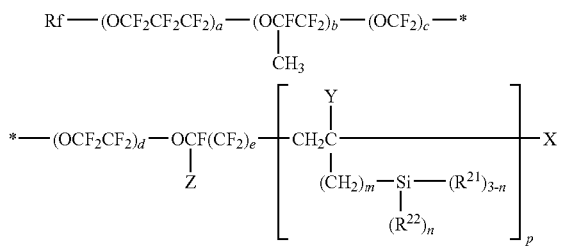

In general formula (7), Rf represents a straight chain or a branched chain perfluoroalkyl group having a carbon number between 1 and 16, X represents an iodine atom or a hydrogen atom, Y represents a hydrogen atom or a lower Alkyl group, Z represents a fluorine atom or a trifluoromethyl group, $R^{21}$ represents a hydrolyzable group, and $R^{22}$ represents a hydrogen atom or an inert and monovalent organic group. Suffixes a, b, c, and d are integers between 0 and 200 respectively, e is either 0 or 1, m and n are respectively integers between 0 and 2, and p is an integer between 1 and 10.

In aforementioned general formula (7), usually Rf represents a straight chain or a branched chain perfluoroalkyl group having a carbon number between 1 and 16. And those groups such as a $CF_3$ group, a $C_2F_5$ group, and a $C_3F_7$ group are preferable. A lower alkyl group possessing a carbon number between 1 and 5, represented by Y, can be given.

Halogen atoms such as a chlorine atom, a bromine atom, and an iodine atom, a $R^{23}O$ group, a $R^{23}COO$ group, a $(R^{24})_2C$=C$(R^{23})CO$ group, a $(R^{23})_2C$=NO group, a $R^{25}C$=NO group, a $(R^{24})_2N$ group, and a $R^{23}CONR^{24}$ group as hydrolyzable groups represented by $R^{21}$ should be used, where $R^{23}$ represents an aliphatic hydrocarbon group having a carbon number usually between 1 and 10 such as an alkyl group and so forth or an aromatic hydrocarbon group having a carbon number usually between 6 and 20 such as a phenyl group and so forth, $R^{24}$ represents a lower aliphatic hydrocarbon group having a carbon number usually between 1 and 5 such as a hydrogen atom, an alkyl group and so forth, and $R^{25}$ represents a divalent aliphatic hydrocarbon group having a carbon number usually between 3 and 6 such as an alkylidene group and so forth.

A chlorine atom, a $CH_3O$ group, a $C_2H_5O$ group, and a $C_3H_7O$ group among those hydrolysis groups are preferably used.

$R^{22}$ represents a hydrogen atom or an inert, monovalent organic group and represents a monovalent hydrocarbon group having a carbon number usually between 1 and 4 such as an alkyl group and so forth preferably. Suffixes a, b, c, and d are integers between 0 and 200 respectively and those integers between 1 and 50 are preferable. m and n are integers between 0 and 2 and they should be 0 preferably. The symbol p represents integers of 1 or not less than 2, an integer between 1 and 10 is preferable, and an integer between 1 and 5 is especially preferable. The number-average molecular weight is $5\times10^2$-$1\times10^5$ and it is $1\times10^3$-$1\times10^4$ preferably.

A compound with a preferable structure as a silane compound expressed in aforementioned general formula (7) is one where Rf is a $C_3F_7$ group, a is an integer between 1 and 50, b, c, and d are 0 respectively, e is 1, Z is a fluorine atom, and n is 0.

Organometallic compounds having organic groups with fluorine atoms used preferably as a silane compound containing fluorine atoms and typical compounds among those compounds expressed in aforementioned general formulae (1)-(7) in the present invention are given below. But, the invention is not limited only to those compounds.

1: $(CF_3CH_2CH_2)_4Si$
2: $(CF_3CH_2CH_2)_2(CH_3)_2Si$
3: $(C_8F_{17}CH_2CH_2)Si(OC_2H_5)_3$
4: $CH_2$=$CHSi(CF_3)_3$
5: $(CH_2$=$CHCOO)Si(CF_3)_3$
6: $(CF_3CH_2CH_2)_2SiCl(CH_3)$
7: $C_8F_{17}CH_2CH_2Si(Cl)_3$
8: $(C_8F_{17}CH_2CH_2)_2Si(OC_2H_5)_2$
9: $CF_3CH_2CH_2Si(OCH_3)_3$
10: $CF_3CH_2CH_2SiCl_3$
11: $CF_3(CF_2)_3CH_2CH_2SiCl_3$
12: $CF_3(CF_2)_5CH_2CH_2SiCl_3$
13: $CF_3(CF_2)_5CH_2CH_2Si(OCH_3)_3$
14: $CF_3(CF_2)_7CH_2CH_2SiCl_3$
15: $CF_3(CF_2)_7CH_2CH_2Si(OCH_3)_3$
16: $CF_3(CF_2)_8CH_2Si(OC_2H_5)_3$
17: $CF_3(CH_2)_2Si(OC_2H_5)_3$
18: $CF_3(CH_2)_2Si(OC_3H_7)_3$
19: $CF_3(CH_2)_2Si(OC_4H_9)_3$
20: $CF_3(CF_2)_5(CH_2)_2Si(OC_2H_5)_3$
21: $CF_3(CF_2)_6(CH_2)_2Si(OC_3H_7)_3$
22: $CF_3(CF_2)_7(CH_2)_2Si(OC_2H_5)_3$
23: $CF_3(CF_2)_7(CH_2)_2Si(OC_3H_7)_3$
24: $CF_3(CF_2)_7(CH_2)_2Si(OCH_3)(OC_3H_7)_2$
25: $CF_3(CF_2)_7(CH_2)_2Si(OCH_3)_2OC_3H_7$
26: $CF_3(CF_2)_7(CH_2)_2SiCH_3(OCH_3)_2$
27: $CF_3(CF_2)_7(CH_2)_2SiCH_3(OC_2H_5)_2$
28: $CF_3(CF_2)_7(CH_2)_2SiCH_3(OC_3H_7)_2$
29: $(CF_3)_2CF(CF_2)_8(CH_2)_2Si(OCH_3)_3$
30: $C_7F_{15}CONH(CH_2)_3Si(OC_2H_5)_3$
31: $C_8F_{17}SO_2NH(CH_2)_3Si(OC_2H_5)_3$
32: $C_8F_{17}(CH_2)_2OCONH(CH_2)_3Si(OCH_3)_3$
33: $CF_3(CF_2)_7(CH_2)_2Si(CH_3)(OCH_3)_2$
34: $CF_3(CF_2)_7(CH_2)_2Si(CH_3)(OC_2H_5)_2$
35: $CF_3(CF_2)_7(CH_2)_2Si(CH_3)(OC_3H_7)_2$
36: $CF_3(CF_2)_7(CH_2)_2Si(C_2H_5)(OCH_3)_2$
37: $CF_3(CF_2)_7(CH_2)_2Si(C_2H_5)(OC_3H_7)_2$

38: $CF_3(CH_2)_2Si(CH_3)(OCH_3)_2$
39: $CF_3(CH_2)_2Si(CH_3)(OC_2H_5)_2$
40: $CF_3(CH_2)_2Si(CH_3)(OC_3H_7)_2$
41: $CF_3(CF_2)_5(CH_2)_2Si(CH_3)(OCH_3)_2$
42: $CF_3(CF_2)_5(CH_2)_2Si(CH_3)(OC_3H_7)_2$
43: $CF_3(CF_2)_2O(CF_2)_3(CH_2)_2Si(OC_3H_7)_3$
44: $C_7F_{15}CH_2O(CH_2)_3Si(OC_2H_5)_3$
45: $C_8F_{17}SO_2O(CH_2)_3Si(OC_2H_5)_3$
46: $C_8F_{17}(CH_2)_2OCHO(CH_2)_3Si(OCH_3)_3$
47: $CF_3(CF_2)_5CH(C_4H_9)CH_2Si(OCH_3)_3$
48: $CF_3(CF_2)_3CH(C_4H_9)CH_2Si(OCH_3)_3$
49: $(CF_3)_2(p\text{-}CH_3\text{-}C_6H_5)COCH_2CH_2CH_2Si(OCH_3)_3$
50: $CF_3CO\text{—}O\text{—}CH_2CH_2CH_2Si(OCH_3)_3$
51: $CF_3(CF_2)_3CH_2CH_2Si(CH_3)Cl_2$
52: $CF_3CH_2CH_2(CH_3)Si(OCH_3)_2$
53: $CF_3CO\text{—}O\text{—}Si(CH_3)_3$
54: $CF_3CH_2CH_2Si(CH_3)Cl_2$
55: $(CF_3)_2(p\text{-}CH_3\text{—}C_6H_5)COCH_2CH_2Si(OCH_3)_3$
56: $(CF_3)_2(p\text{-}CH3\text{—}C_6H_5)COCH_2CH_2Si(OC_6H_5)_3$
57: $(CF_3C_2H_4)(CH_3)_2Si\text{—}O\text{—}Si(CH_3)_3$
58: $(CF_3C_2H_4)(CH_3)_2Si\text{—}O\text{—}Si(CF_3C_2H_4)(CH_3)_2$
59: $CF_3(OC_3F_6)_{24}\text{—}O\text{—}(CF_2)_2\text{—}CH_2\text{—}O\text{—}CH_2Si(OCH_3)_3$
60: $CF_3O(CF(CF_3)CF_2O)_mCF_2CONHC_3H_6Si(OC_2H_5)_3$ (m=11-30)
61: $(C_2H_5O)_3SiC_3H_6NHCOCF_2O(CF_2O)_n(CF_2CF_2O)_pCF_2CONHC_3H_6Si(OC_2H_5)_3$ (n/p=about 0.5, the number-average molecular weight=about 3000)
62: $C_3F_7\text{—}(OCF_2CF_2CF_2)_q\text{—}O\text{—}(CF_2)_2\text{—}[CH_2CH\{Si\text{—}(OCH_3)_3\}]_9\text{—}H$ (q=about 10)
63: $F(CF(CF_3)CF_2O)_{15}CF(CF_3)CONHCH_2CH_2CH_2Si(OC_2H_5)_3$
64: $F(CF_2)_4[CH_2CH(Si(OCH_3)_3)]_{2.02}OCH_3$
65: $(C_2H_5O)_3SiC_3H_6NHCO\text{—}[CF_2(OC_2F_4)_{10}(OCF_2)_6OCF_2]CONHC_3H_6Si(OC_2H_5)_3$
66: $C_3F_7(OC_3F_6)_{24}O(CF_2)_2CH_2OCH_2Si(OCH_3)_3$
67: $CF_3(CF_2)_3(C_6H_4)C_2H_4Si(OCH_3)_3$
68: $(CF_3)_2CF(CF_2)_6CH_2CH_2SiCH_3(OCH_3)_2$
69: $CF_3(CF_2)_3(C_6H_4)C_2H_4SiCH_3(OCH_3)_2$
70: $CF_3(CF_2)_5(C_6H_4)C_2H_4Si(OC_2H_5)_3$
71: $CF_3(CF_2)_3C_2H_4Si(NCO)_3$
72: $CF_3(CF_2)_5C_2H_4Si(NCO)_3$
73: $C_9F_{19}CONH(CH_2)_3Si(OC_2H_5)_3$
74: $C_9F_{19}CONH(CH_2)_3SiCl_3$
75: $C_9F_{19}CONH(CH_2)_3Si(OC_2H_5)_3$
76: $C_3F_7O(CF(CF_3)CF_2O)_2\text{—}CF(CF_3)\text{—}CONH(CH_2)Si(OC_2H_5)_3$
77: $CF_3O(CF(CF_3)CF_2O)_6CF_2CONH(CH_2)_3SiOSi(OC_2H_5)_2(CH_2)_3NHCOCF_2(OCF_2CF(CF_3))_6OCF_3$
78: $C_3F_7COOCH_2Si(CH_3)_2OSi(CH_3)_2CH_2OCOC_3F_7$
79: $CF_3(CF_2)_7CH_2CH_2O(CH_2)_3Si(CH_3)_2OSi(CH_3)_2(CH_2)_3OCH_2CH_2(CF_2)_7CF_3$
80: $CF_3(CF_2)_5CH_2CH_2O(CH_2)_2Si(CH_3)_2OSi(CH_3)_2(OC_2H_5)$
81: $CF_3(CF_2)_5CH_2CH_2O(CH_2)_2Si(CH_3)_2OSi(CH_3)(OC_2H_5)_2$
82: $CF_3(CF_2)_5CH_2CH_2O(CH_2)_2Si(CH_3)_2OSi(CH_3)_2OSi(CH_3)_2(OC_2H_5)$ Compounds other than those shown above as alkoxysilane substituted by fluorine atoms are given.
83: (perfluoropropyloxy)dimethylsilane
84: tris(perfluoropropyloxy)methylsilane
85: dimethylbis(nonafluorobutoxy)silane
86: methyltris(nonafluorobutoxy)silane
87: bis(perfluoropropyloxy)diphenylsilane
88: bis(perfluoropropyloxy)methylvinylsilane
89: bis(1,1,1,3,3,4,4,4-octafluorobutoxy) dimethylsilane
90: bis(1,1,1,3,3,3-hexafluoroisopropoxy) dimethylsilane
91: tris(1,1,1,3,3,3-hexafluoroisopropoxy) methylsilane
92: tetrakis(1,1,1,3,3,3-hexafluoroisopropoxy)silane
93: dimethylbis(nonafluoro-t-butoxy)silane
94: bis(1,1,1,3,3,3-hexafluoroisopropoxy) diphenylsilane
95: tetrakis(1,1,3,3-tetrafluoroisopropoxy)silane
96: bis[1,1-bis(trifluoromethyl)ethoxy]dimethylsilane
97: bis(1,1,1,3,3,4,4,4-octafluoro-2-butoxy) dimethylsilane
98: methyltris[2,2,3,3,3-pentafluoro-1,1-bis (trifluoromethyl)propoxy]silane
99: diphenylbis[2,2,2-trifluoro-1-(trifluoromethyl)-1-tolylethoxy]silane Other compounds are given below.
100: $(CF_3CH_2)_3Si(CH_2\text{—}NH_2)$
101: $(CF_3CH_2)_3Si\text{—}N(CH_3)_2$ 102: $(CF_3CH_2)_3\text{—}Si\text{—}CH_2CH_2\text{—}N\text{(piperidinyl)}$ 103: $(CF_3CH_2)_2\text{—}Si\text{—}(NH\text{-phenyl})_2$ Further, 104: $CF_3CH_2CH_2\text{—}\underset{CH_3}{\overset{H}{Si}}\text{—}\underset{}{\overset{H}{N}}\text{—}\underset{CH_3}{\overset{H}{Si}}\text{—}CH_3$ 105: $CF_3CH_2CH_2\text{—}\underset{CH_3}{\overset{CH_3}{Si}}\text{—}\overset{H}{N}\text{—}\underset{CH_3}{\overset{CH_3}{Si}}\text{—}CH_3$ such as a silazane and so forth.
106: $CF_3CH_2\text{—}CH_2TiCl_3$
107: $CF_3(CF_2)_3CH_2CH_2TiCl_3$
108: $CF_3(CF_2)_5CH_2Ti(OCH_3)_3$
109: $CF_3(CF_2)_7CH_2CH_2TiCl_3$
110: $Ti(OC_3F_7)_4$
111: $(CF_3CH_2\text{—}CH_2O)_3TiCl_3$
112: $(CF_3C_2H_4)(CH_3)_2Ti\text{—}O\text{—}Ti(CH_3)_3$ Samples of organometallic compounds containing fluorine atoms can be given below.
113: $CF_3(CF_2)_3(CH_2CH_2O(CH_2)_3GeCl$
114: $CF_3(CF_2)_3CH_2CH_2OCH_2Ge(OCH_3)_3$
115: $(C_3F_7O)_2Ge(OCH_3)_2$
116: $[(CF_3)_2CHO]_4Ge$
117: $[(CF_3)_2CHO]_4Zr$
118: $(C_3F_7CH_2CH_2)_2Sn(OC_2H_5)_2$
119: $(C_3F_7CH_2CH_2)Sn(OC_2H_5)_3$
120: $Sn(OC_3F_7)_4$
121: $CF_3CH_2CH_2CH_2In(OCH_3)_2$
122: $In(OCH_2CH_2OC_3F_7)_3$
123: $Al(OCH_2CH_2OC_3F_7)_3$
124: $Al(OC_3F_7)_3$
125: $Sb(OC_3F_7)_3$
126: $Fe(OC_3F_7)_3$ 127: Cu(OCH$_2$CH$_2$OC$_3$F$_7$)$_2$
128: C$_3$F$_7$(OC$_3$F$_6$)$_{24}$O(CF$_2$)$_2$CH$_2$OCH$_2$Si(OCH$_3$)$_3$

129

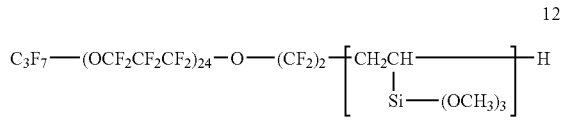

Each compound given by those actual examples has been put on the market by Dow Corning Toray Silicone Co., Ltd, Shin-Etsu Chemical Co., Ltd, Daikin Industries, Ltd (OP-TOOL DSX, for example), and Gelest Inc., Solvay Solexis Inc., and so forth and those compounds can be easily purchased. Those compounds can be manufactured by the synthesis method described in J. Fluorine Chem., 79(1), 87(1996), Zairyou Gijutsu, 16(5), 209(1998), Collect. Czech. Chem. Commun., vol. 44, 750-755, J. Amer. Chem. Soc. vol. 112, 2341-2348(1990), vol. 44, 750-755, J. Amer. Chem. Soc. vol. 112, 2341-2348(1990), Inorg. Chem., vol. 10, 889-892 (1971), U.S. Pat. No. 3,668,233, Japanese Patent. O.P.I. Publication No.58-122979, Japanese Patent O.P.I. Publication No.7-242675, Japanese Patent O.P.I. Publication No.9-61605, Japanese Patent O.P.I. Publication No.11-29585, Japanese Patent O.P.I. Publication No.2000-64348, Japanese Patent O.P.I. Publication No.2000-144097, and so forth, for examples. Or, those compounds can be manufactured by synthesis techniques based on this method.

Examples provided for the preferable organosilicon compound include types of tri alkoxy silanes, tri acyloxy silane and tri phenoxy silanes such as methyl trimethoxy silane, methyl triethoxy silane, methyl trimethoxyethoxy silane, methyl triacetoxy silane, methyl tripropoxy silane, methyl tributoxy silane, ethyl trimethoxy silane, ethyl triethoxy silane, vinyl trimethoxy silane, vinyl triethoxy silane, vinyl triacetoxy silane, vinyl trimethoxyethoxy silane, phenyl trimethoxy silane, phenyl triethoxy silane, phenyl triacetoxy silane, γ-chloropropyl trimethoxy silane, γ-chloropropyl triethoxy silane, γ-chloropropyl triacetoxy silane, γ-methacryloxypropyl trimethoxy silane, γ-aminopropyl trimethoxy silane, γ-aminopropyl triethoxy silane, γ-mercaptopropyl trimethoxy silane, γ-mercaptopropyl triethoxy silane, N-β-(aminoethyl)-γ-aminopropyl trimethoxy silane, β-cyanoethyl triethoxy silane, methyl triphenoxy silane, chloromethyl trimethoxy silane, chloromethyl triethoxy silane, glycidoxymethyl trimethoxy silane, glycidoxymethyl triethoxy silane, α-glycidoxyethyl trimethoxy silane, α-glycidoxyethyl triethoxy silane, β-glycidoxyethyl trimethoxy silane, β-glycidoxyethyl triethoxy silane, α-glycidoxypropyl trimethoxy silane, α-glycidoxypropyl triethoxy silane, β-glycidoxypropyl trimethoxy silane, β-glycidoxypropyl triethoxy silane, γ-glycidoxypropyl trimethoxy silane, γ-glycidoxypropyl triethoxy silane, γ-glycidoxypropyl tripropoxy silane, γ-glycidoxypropyl tributoxy silane, γ-glycidoxypropyl trimethoxyethoxy silane, γ-glycidoxypropyl triphenoxy silane, α-glycidoxybutyl trimethoxy silane, α-glycidoxybutyl triethoxy silane, β-glycidoxybutyl trimethoxy silane, β-glycidoxybutyl triethoxy silane, γ-glycidoxybutyl trimethoxy silane, γ-glycidoxybutyl triethoxy silane, δ-glycidoxybutyl trimethoxy silane, δ-glycidoxybutyl triethoxy silane, (3, 4-epoxycyclohexyl)methyl trimethoxy silane, (3, 4-epoxycyclohexyl)methyl triethoxy silane, β-(3, 4-epoxycyclohexyl)ethyl trimethoxy silane, β-(3, 4-epoxycyclohexyl)ethyl triethoxy silane, β-(3, 4-epoxycyclohexyl)ethyl tripropoxy silane, β-(3, 4-epoxycyclohexyl)ethyl tributoxy silane, β-(3, 4-epoxycyclohexyl)ethyl trimethoxyethoxy silane, γ-(3, 4-epoxycyclohexyl)propyl trimethoxy silane, β-(3, 4-epoxycyclohexyl)ethyl triphenoxy silane, γ-(3, 4-epoxycyclohexyl) propyl trimethoxy silane, γ-(3, 4-epoxycyclohexyl)propyl triethoxy silane, and δ-(3, 4-epoxycyclohexyl)butyl trimethoxy silane; and types of dialkoxy silane, diphenoxy silane, diacyl oxysilane, trimethyl ethoxy silane, trimethyl methoxy silane, 3,3,3-trifluoropropyltrimethoxysilane, dimethoxymethyl-3,3,3-trifluoropropylsilane, fluoroalkylsilane, hexamethyldisilane, and hexamethyldisiloxane such as dimethyl dimethoxy silane, phenylmethyl dimethoxy silane, dimethyl diethoxy silane, phenylmethyl diethoxy silane, γ-chloropropylmethyl dimethoxy silane, γ-chloropropylmethyl diethoxy silane, dimethyl diacetoxy silane, γ-methacryloxypropylmethyl dimethoxy silane, γ-methacryloxypropylmethyl diethoxy silane, γ-mercaptopropylmethyl dimethoxy silane, γ-mercaptopropylmethyl diethoxy silane, γ-aminopropylmethyl dimethoxy silane, γ-aminopropylmethyl diethoxy silane, methylvinyl dimethoxy silane, methylvinyl diethoxy silane, glycidoxymethylmethyl dimethoxy silane, glycidoxymethylmethyl diethoxy silane, α-glycidoxyethylmethyl dimethoxy silane, α-glycidoxyethylmethyl diethoxy silane, β-glycidoxyethylmethyl dimethoxy silane, β-glycidoxyethylmethyl diethoxy silane, α-glycidoxypropylmethyl dimethoxy silane, α-glycidoxypropylmethyl diethoxy silane, β-glycidoxypropylmethyl dimethoxy silane, β-glycidoxypropylmethyl diethoxy silane, γ-glycidoxypropylmethyl dimethoxy silane, γ-glycidoxypropylmethyl diethoxy silane, γ-glycidoxypropyl methyl dipropoxy silane, γ-glycidoxypropylmethyl dibutoxyethoxy silane, γ-glycidoxypropylmethyl dimethoxyethoxy silane, γ-glycidoxypropylmethyl diphenoxy silane, γ-glycidoxypropyl methyl diacetoxy silane, γ-glycidoxypropylethyl dimethoxy silane, γ-glycidoxypropylethyl diethoxy silane, γ-glycidoxypropylvinyl dimethoxy silane, γ-glycidoxypropylvinyl diethoxy silane, γ-glycidoxypropylphenyl dimethoxy silane and γ-glycidoxypropylphenyl diethoxy silane.

Organosilicon compounds are not limited to the above compounds. They may also be employed singly, or not less than two different kinds of compounds may be used at the same time.

Among the foregoing compounds, preferably provided are methyl triethoxy silane, ethyl triethoxy silane, dimethyl diethoxy silane, dimethyl dimethoxy silane, isopropyl trimethoxy silane, isopropyl triethoxy silane, butyl trimethoxy silane and trimethyl ethoxy silane.

Compounds expressed by following general formula (8) are used as the other organosilicon compound, wherein n is 0-2000. R$_{81}$-R$_{88}$ are hydrogen atoms, or straight, branched or cyclic hydrocarbon groups which may be either saturated or unsaturated. Each of them may be either the same or different.

General formula (8)

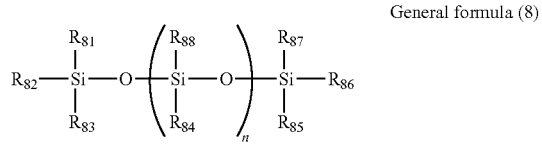

Compounds fitted into general formula (1) can be selected from Silicon compound reagents produced by Shin-Etsu chemicals Co., Ltd., or reagents described in the compound catalogs of Metal-organics for material & polymer technology (Gelest, Inc.) and Silicon chemicals (Chisso corporation) to be utilized, and examples of those compounds capable of using are described below. Of course, they are not limited to those compounds.

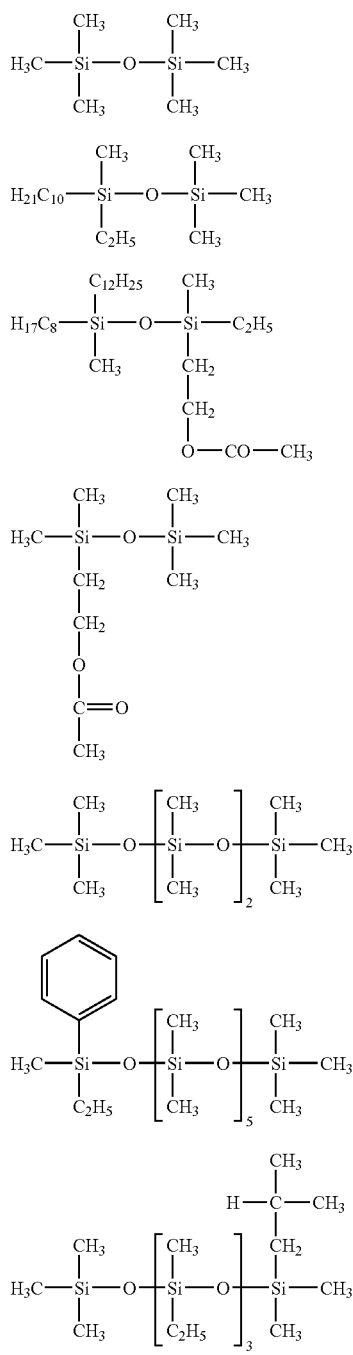

Fluorinated compounds can be used as the other raw material, and organic fluorinated compounds such as fluorinated carbon gas, fluorinated hydrocarbon gas and others can be used. Examples of the fluorinated carbon gas include tetrafluoromethane, tetrafluoroethylene, hexafluoropropylene and octafluorocyclobutane. Examples of the above fluorinated hydrocarbon gas include difluoromethane, tetrafluoroethane, tetrafluoropropylene and trifluoropropylene. Examples provided, further, include halide of a fluorinated hydrocarbon compound such as chlorotrifluoromethane, chlorodifluoromethane or dichlorotetrafluorocyclobutane, fluoroalcohol such as trifluoromethanol or pentafluoroethanol, fluorinated aliphatic acid such as trifluoroacetic acid or pentafluoropropionic acid, and an organic fluorinated compound such as fluorinated ketone of hexafluoroacetone and so forth. They are not limited to those compounds and acids described above. Those compounds may contain a fluorinated ethylenically unsaturated group within a molecule.

It is preferable that a film of the present invention is formed on a gate insulating layer, and an organic semiconductor layer is provided further on the film. The film thickness is preferably from a thickness of a single molecular layer to 100 nm, and more preferably from a thickness of a single molecular layer to 10 nm.

A contact angle against pure water of a surface of the film is also required to be not less than 50° to acquire effect of the present invention, preferably 70-170°, and more preferably 90-130°. An ON/OFF ratio and carrier mobility of a transistor decrease prominently when the contact angle is low, and coatability of a semiconducting material solution also drops when the contact angle is too high.

Though a bottom gate type thin-film transistor depends largely on surface profiles of the substrate, the gate electrode and the gate insulating layer, it is preferable from the aspect of carrier mobility that surface roughness Ra of the film surface is roughly 0.01-10 nm.

Even though as a film formation method there are methods provided other than the foregoing atmospheric pressure plasma method such as a thermal CVD method in which a film is formed via thermal reaction by supplying reactive gas containing the raw material onto a heated substrate in the range of 50-500° C., and a common plasma CVD in which a film is formed under reduced pressure of 0.01-100 Pa employing the foregoing apparatus, and both discharge gas and reactive gas, to acquire effect of the present invention, the atmospheric pressure plasma method is most preferably used from the aspect of increased mobility, film evenness, speed of forming a film, and efficient productivity.

After pretreatment (washing) is conducted by exposing a substrate for the film formation in the present invention, placed in discharge space, to excited discharge gas, it is preferred that the film formation is carried out. 90-99.9% by volume of the foregoing inert gas and 0.01-10% by volume of at least one kind selected from oxygen, ozone, hydrogen peroxide, and hydrogen are used as the mixed gas at this time. Ether nitrogen or argon, and oxygen are preferably used. Effect of removing impurities which affect adversely to transistor characteristics can be obtained by the above treatment. Further, effect of enhanced reactivity via reactive gas to form a film of the present invention as well as effect of improved evenness and density of the film, and increased carrier mobility of a transistor can be obtained, when there are provided metallic oxides such as silicon oxide and so forth on the surface of a substrate.

It is desired that a contact angle against pure water of a surface of the film is set to 1-30°, when there are provided metallic oxides such as silicon oxide and so forth on the surface of a substrate, and preferably to 3-20°.

The common information concerning an organic thin-film transistor and its manufacturing method in the present invention will subsequently be described.

Figure 12:
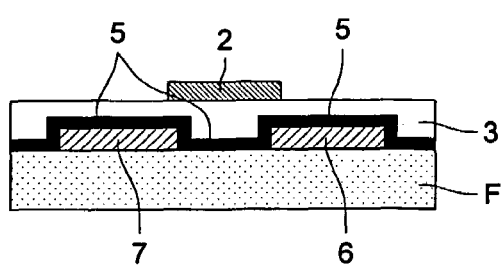
FIG. 12 shows an example of the constitution of the organic thin-film transistor.
Figure 12:
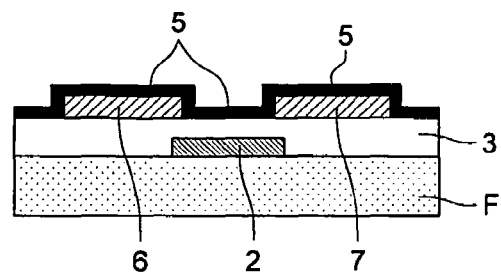
Figure 12:
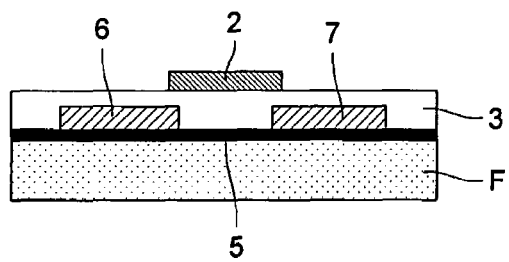

As the organic thin-film transistor, there are a top gate type transistor (FIG. 12(a) and FIG. 12(b)) possessing organic semiconductor layer 5 on substrate F, the organic semiconductor layer contacting source electrode 6 and drain electrode 7 on the surface of the support, gate insulating layer 3 on the organic semiconductor layer, and a gate electrode on the gate insulating layer, and a bottom gate type transistor (FIG. 12(c)) possessing gate electrode 2 on the surface of substrate F, organic semiconductor layer 5 on the substrate, the organic semiconductor layer contacting source electrode 6 and drain electrode 7, the gate insulating layer on the organic semiconductor layer, and the gate electrode on the gate insulating layer. Each of the above types is acceptable. The bottom gate type, however, is specifically preferable in the case of the present invention.

The organic thin-film transistor of the present invention possesses either a subbing layer containing a compound selected from inorganic oxides or inorganic nitrides, or a subbing layer containing a polymer.

Examples of the inorganic oxide contained in the subbing layer include silicon oxide, aluminum oxide, tantalum oxide, titanium oxide, tin oxide, vanadium oxide, barium strontium lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. An inorganic nitride such as silicon nitride or aluminum nitride can be also suitably used.

Of these, silicon oxide, aluminum oxide, tantalum oxide, titanium oxide, or silicon nitride is preferred.

In the present invention, the subbing layer containing a compound selected from inorganic oxides or inorganic nitrides is preferably formed according to the atmospheric pressure plasma method described above.

Examples of the polymer used in the subbing layer include a polyester resin, a polycarbonate resin, a cellulose resin, an acryl resin, a polyurethane resin, a polyethylene resin, a polypropylene resin, a polystyrene resin, a phenoxy resin, a norbornene resin, an epoxy resin, vinyl chloride-vinyl acetate copolymer, a vinyl chloride resin, vinyl acetate-vinyl alcohol copolymer, a partially saponificated vinyl chloride-vinyl acetate copolymer, vinyl chloride-vinylidene chloride copolymer, vinyl chloride-acrylonitrile copolymer, ethylene-vinyl alcohol copolymer, polyvinyl alcohol, chlorinated polyvinyl chloride, ethylene-vinyl chloride copolymer, ethylene-vinyl acetate copolymer, a polyamide resin, an ethylene-butadiene resin, a butadiene-acrylonitrile resin, a silicone resin, and a fluorine-containing resin.

As the organic semiconductive materials in the present invention, π-conjugated materials are used. Examples of the π-conjugated materials include polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly (3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene,chrysene, dibenzopentacene, tertabenzopentacene, pyrene, dibenzopyrene, perylene, coronene, terylene, ovalene, quaterrylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790.

Further, oligomers having repeating units in the same manner as in the above polymers, for example, thiophene hexamers including α-sexithiophene, α,ω-dihexyl-α-sexithiophene, α,ω-dihexyl-α-quinquethiophene, and α, ω-bis(3-butoxypropyl)-α-sexithiophene, or styrylbenzene derivatives, can be suitably employed.

Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl) naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallic phthalocyanines.

Further, employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

In the present invention, the organic semiconductor layer may be subjected to a so-called doping treatment by incorporating in the layer, materials working as an acceptor which accepts electrons, for example, acrylic acid, acetamide, materials having a functional group such as a dimethylamino group, a cyano group, a carboxyl group and a nitro group, benzoquinone derivatives, or tetracyanoethylene, tetracyanoquinodimethane or their derivatives, or materials working as a donor which donates electrons, for example, materials having a functional group such as an amino group, a triphenyl group, an alkyl group, a hydroxyl group, an alkoxy group, and a phenyl group; substituted amines such as phenylenediamine; anthracene, benzanthracene, substituted benzanthracenes, pyrene, substituted pyrene, carbazole and its derivatives, and tetrathiafulvalene and its derivatives.

The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant. As the dopant in the present invention, a known dopant can be used.

The methods for forming the organic semiconductor layer include a vacuum deposition method, a molecular beam epitaxial growth method, an ion cluster beam method, a low energy ion beam method, an ion plating method, a CVD method, a sputtering method, a plasma polymerization method, an electrolytic polymerization method, a chemical polymerization method, a spray coating method, a spin coating method, a blade coating method, a dip coating method, a casting method, a roll coating method, a bar coating method, a die coating method, and an LB method. These methods may be used according to kinds of materials used. Of these, a spin coating method, a blade coating method, a dip coating method, a roll coating method, a bar coating method and a die coating method by which a layer can be formed not only simply but also precisely, using an organic semiconductor solution, are preferably used in consideration of productivity. Herein, toluene, xylene, chlorobenzene, chloroform, dichloromethane, dichloroethane, or tetrahydrofuran (THF) can be employed as an organic solvent used for the semiconducting material solution.

When a precursor such as pentacene is soluble in a solvent as disclosed in Advanced Material 1999, Vol. 6, p. 480-483, a precursor layer formed by coating of the precursor solution may be heat treated to form an intended organic material layer.

The thickness of the organic semiconductor layer is not specifically limited. The thickness of an active layer composed of the organic semiconductor materials often has a great influence on properties of the resultant transistor. Accordingly, the thickness of the layer differs due to kinds of the organic semiconductor materials used, but it is ordinarily not more than 1 µm, and preferably 10-300 nm.

In the present invention, materials for forming a source electrode, a drain electrode and a gate electrode are not specifically limited, as long as they are electrically conductive. Examples thereof include platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Platinum, gold, silver, copper, aluminum, indium, indium oxide-tin (ITO) and carbon are preferred. Further, known electrically conductive polymers whose electrical conductivity is improved by doping are preferably used. Examples thereof include electrically conductive polyaniline, electrically conductive polypyrrole, electrically conductive polythiophene, and complex of electrically conductive polyethylenedioxythiophene and polystyrene sulfonic acid. Of these, ones, which provide a low electric resistance at an interface with the semiconductor layer, are preferred.

As a method for forming the electrode, there are a method in which the electrode is formed according to a commonly known photolithography or lift-off method from an electrically conductive layer of the conductive material described above formed according to a vacuum deposition method or a sputtering method, a method in which the electrode is formed according to thermal transfer of the conductive material to a foil of a metal such as aluminum or copper, and a method in which the electrode is formed by etching a resist of the conductive material formed by an ink jet method. The electrode may be formed by ejecting in the form of electrode a solution or dispersion liquid of an electrically conductive polymer or a dispersion liquid of electrically conductive particles onto the surface on which the electrode is to be directly formed by the ink jet method or by subjecting to photolithography or laser ablation via the coated layer of the solution or the dispersion liquid. Further, employing ink or conductive paste containing an electrically conductive polymer or electrically conductive particles, the electrode may be formed by printing in the electrode pattern onto the surface on which the electrode is to be formed according to a printing method such as letterpress printing, intaglio printing, planographic printing or screen printing.

Various insulating films may be employed as the gate insulating layer. The insulating layer is preferably an inorganic oxide film composed of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum, oxide or titanium oxide is particularly preferred. An inorganic nitride such as silicon nitride or aluminum nitride can be also suitably used.

The methods for forming the above film include a dry process such as a vacuum deposition method; a molecular beam epitaxial growth method, an ion cluster beam method, a low energy ion beam method, an ion plating method, a CVD method, a sputtering method, or an atmospheric pressure plasma method, a wet process such as a spray coating method, a spin coating method, a blade coating method, a dip coating method, a casting method, a roll coating method, a bar coating method, or a die coating method, and a patterning method such as a printing method or an ink-jet method. These methods can be used, depending on kinds of materials used in the insulating layer.

As the typical wet process, there can be used a method of coating a dispersion liquid obtained by dispersing inorganic oxide particles in an organic solvent or water optionally in the presence of a dispersant such as a surfactant and drying, or a so-called sol gel method of coating a solution of an oxide precursor such as an alkoxide and drying.

Among the above, the preferred is an atmospheric pressure plasma method. The formation of a gate insulating layer is made possible at atmospheric pressure or approximately atmospheric pressure by the foregoing apparatus and the layer formation method.

In order to obtain a silicon oxide layer, inert gas such a s argon, helium, or nitrogen is provided as the discharge gas, and a mixed gas of oxygen and a compound such as tetraethoxy silane, tetramethoxy silane, or tetraisopropoxy silane is also employed as the reactive gas. A titanium oxide layer can also be acquired by changing these silane compounds into a titanium compound such as tetraethoxy titanium or tetraisopropoxy titanium. Continuous production at increased productivity can be carried out via formation and surface washing of a gate insulating layer, and surface treatment of a thin film described before by combining another method of the present invention.

As the gate insulating layer, an organic compound film can also be used. Examples of the organic compound used in the organic compound film include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, and cyanoethylpullulan. As a method of forming the organic compound film, the wet process described above is preferably used.

The inorganic oxide film and the organic oxide film can be laminated to use in combination. The thickness of the insulating film above is generally from 50 nm to 3 μm, and preferably from 100 nm to 1 μm.

A substrate is made of glass or a flexible resin sheet, and a plastic film, for example, can be employed as a sheet. Examples of the plastic sheet include polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of such a resin sheet makes it possible to decrease weight, to enhance portability, and to enhance durability against impact due to its flexibility, as compared to glass.

Figure 10:
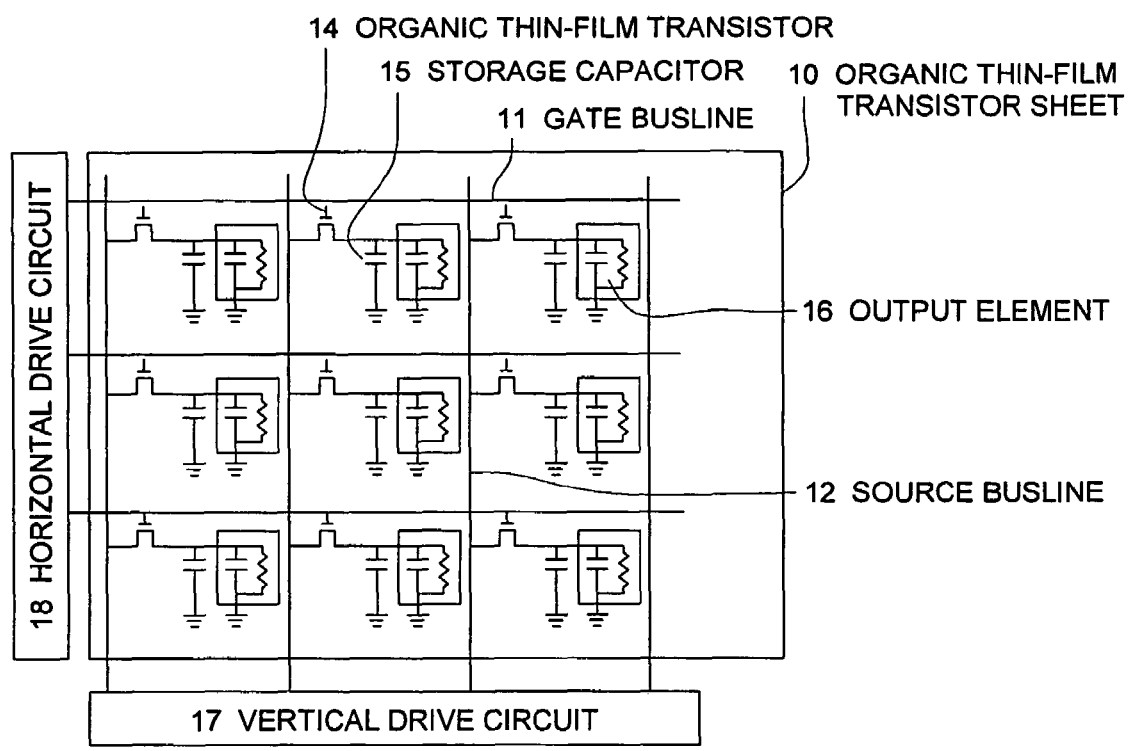
FIG. 10 shows an example of the schematic equivalent circuit drawing of the organic thin-film transistor sheet in the present invention.

FIG. 10 shows an example of the schematic equivalent circuit drawing of organic thin-film transistor sheet 10 in which plural organic thin-film transistors of the present invention are placed.

The thin-film transistor sheet 1 possesses many thin-film transistors 14 arranged in a matrix form. Numerical number 11 is a gate bus line of the gate electrode of each of thin-film transistors 14, and numerical number 12 a source bus line of the source electrode of each of thin-film transistors 14. Output element 16 is connected to the drain electrode of each of organic thin-film transistors 14. Output element 16 is for example, a liquid crystal or an electrophoresis element, which constitutes pixels in a display. In the figure, liquid crystal as output element 16 is shown in an equivalent circuit diagram comprised of a capacitor and a resistor. Numerical number 15 shows a storage capacitor, numerical number 17 a vertical drive circuit, and numerical number 18 a horizontal drive circuit.

Next, the present invention will be explained employing examples, but is not limited thereto.

EXAMPLE

Example 1

The surface of a 100 μm thick PES film substrate F was subjected to corona discharge treatment at 50 W/m²/min and then coated with a coating liquid having the following composition to obtain a layer of a dry thickness of 2 μm. The resulting layer was dried at 90° C. for 5 minutes, and hardened by being exposed for 4 seconds employing a 60 W/cm high pressure mercury lamp 10 cm distant from the layer.

| | |
|---|---|
| Dipentaerythritol hexacrylate monomer | 60 g |
| Dipentaerythritol hexacrylate dimmer | 20 g |
| Dipentaerythritol hexacrylate trimer or polymer higher than the trimer | 20 g |
| Diethoxybenzophenone (UV-initiator) | 2 g |
| Silicon-containing surfactant | 1 g |
| Methyl ethyl ketone | 75 g |
| Methyl propylene glycol | 75 g |

A 50 nm thick silicon oxide layer was formed further on this layer by being subjected to continuous atmospheric pressure plasma treatment under the following condition, and subbing layer 1 having a two-layer structure was prepared on substrate F.

| (GAS USED) | |
|---|---|
| Inert gas: Helium | 98.25% by volume |
| Reactive gas: Argon gas | 1.5% by volume |
| Reactive gas: Tetraethoxysilane vapor (bubbled with helium gas) | 0.25% by volume |
| (CONDITION OF DISCHARGE) | |
| Discharge output power: | 10 W/cm² |

Herein, a discharging process was carried out with a frequency of 13.56 MHz employing a high frequency power supply produced by Pearl Kogyo Co., Ltd.

(Condition of Electrodes)

A stainless steel jacket roll base material having a cooling device employing chilled water was coated to have a 1 mm thick alumina layer on the base material via thermally spraying. After that, a solution prepared by diluting tetramethoxysilane with ethyl acetate was coated on the resulting electrode, dried, hardened by UV ray irradiation to carry out sealing treatment, and smoothed to give an dielectric layer (dielectric constant: 10) with an Rmax of 5 μm on the surface of the material. Thus, a roll electrode was obtained. Further, a hollow rectangular stainless steel pipe was processed via coating in the same manner as above to obtain a dielectric electrode as a voltage application electrode. The roll electrode was electrically grounded.

Figure 11:
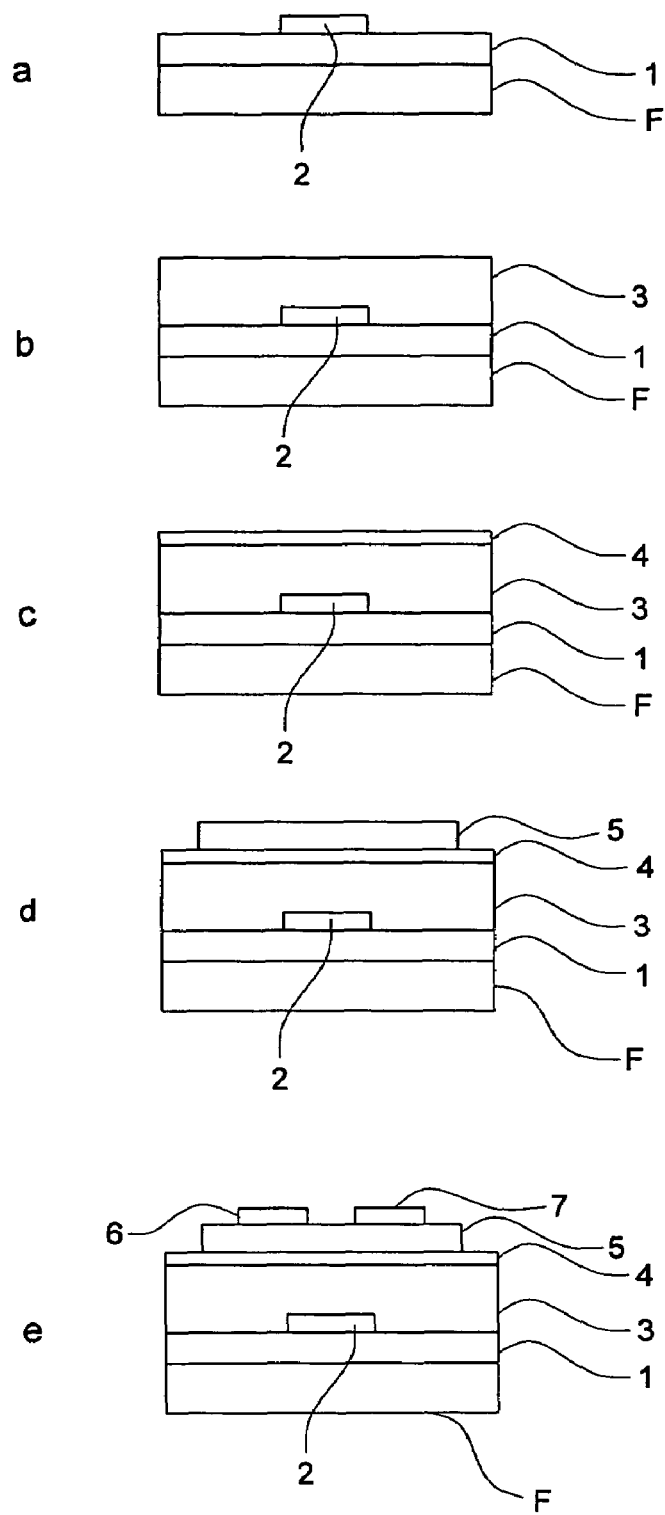
FIG. 11 is a figure explaining the method for manufacturing the organic thin-film transistor in the present invention.

A 200 nm thick aluminum film was deposited on subbing layer 1 via sputtering to prepare gate electrode 2 (FIG. 11-a). A 200 nm thick silicon oxide layer was further formed at 200° C. in film temperature via the foregoing atmospheric pressure plasma method to prepare gate insulating layer 3 (FIG. 11-b).

Next, film 4 containing a silane compound concerning the present invention was formed on gate insulating layer 3 by being subjected to continuous atmospheric pressure plasma surface treatment for 5 seconds under the following condition (FIG. 11-c).

| | |
|---|---|
| Inert gas: Helium | 98.9% by volume |
| Reactive gas: Hydrogen gas | 1.0% by volume |
| Reactive gas: Methyltriethoxysilane vapor (bubbled with helium gas) | 0.1% by volume |
| (CNDITION OF DISCHARGE) | |
| Discharge output power: | 3.0 W/cm² |

Herein, a discharging process was carried out with a frequency of 13.56 MHz employing a high frequency power supply produced by Pearl Kogyo Co., Ltd.

A chloroform solution of a pentacene precursor having a structure described below was ejected onto the film where channel was to be formed, employing a piezo type ink jet printer, and was heated at 200° C. for 10 minutes to obtain an organic semiconductor layer 5 of a 50 nm thick pentacene film (FIG. 11-d).

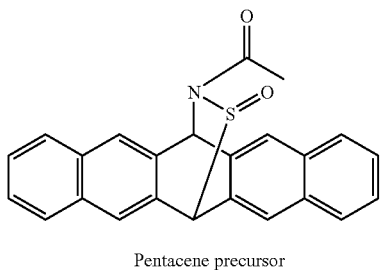

Pentacene precursor

Subsequently, after an aqueous dispersion (BAYTRON P produced by Bayer Co., Ltd.) of polystyrene sulfonic acid and poly(ethylenedioxythiophene) was ejected onto source and drain electrodes employing a piezo type ink jet, and a patterning and a natural drying processes were carried out, a heat treatment process was conducted in nitrogen gas atmosphere at 70° C. for 10 minutes to form source electrode 6 and drain electrode 7 (FIG. 11-*c*). An organic thin-film transistor having channel length L=20 μm (the present invention Sample No. 1) was prepared by the above method.

The present invention Sample No. 2 was prepared, similarly to the present invention Sample No. 1, except that hexyl triethoxy silane was employed in place of methyl triethoxy silane in the present invention Sample No. 1. In a similar way, the present invention Sample No. 3 was prepared, similarly to the present invention Sample No. 1, except that trifluoromethylethyl triethoxy silane was employed in place of methyl triethoxy silane. The present invention Sample No. 4 was also prepared, similarly to the present invention Sample No. 1, except that methyltriisopropoxy titanium was employed in place of methyl triethoxy silane.

An organic thin-film transistor which was not subjected to atmospheric pressure plasma surface treatment (comparative Sample No. 1) was further prepared.

Shown below are measured results of a contact angle against pure water in the case of thin film Sample Nos. 1-4 in the present invention as well as in the case of not being subjected to atmospheric pressure plasma surface treatment. The measured values are based on 40 seconds after dropping pure water on the samples.

| Sample No. 1 | 78° |
|---|---|
| Sample No. 2 | 85° |
| Sample No. 3 | 95° |
| Sample No. 4 | 76° |
| Comparative sample No. 1 | 43° |

Thin-film transistor Sample Nos. 1-4 of the present invention exhibited good working property as a p-channel enhancement type FET (field-effect transistor). The drain current was measured by sweeping the gate bias voltage from −20 V to +70 V when the drain bias voltage of each sample was set to −60 V to measure the carrier mobility at a saturated region. Measured results are shown in the following table.

| Sample No. | Silane or titanium compound | Carrier mobility (cm²/Vs) |
|---|---|---|
| Present invention No. 1 | methyl triethoxy silane | 0.25 |
| Present invention No. 2 | hexyl triethoxy silane | 0.28 |
| Present invention No. 3 | trifluoromethylethyl triethoxy silane | 0.35 |
| Present invention No. 4 | methyltriisopropoxy titanium | 0.24 |
| Comparative Sample No. 1 | in the case of not being subjected to atmospheric pressure plasma surface treatment | 0.15 |

It is to be understood via this table that the present invention samples exhibit higher carrier mobility than the comparative sample.

Example 2

The present invention Sample Nos. 5-8 and comparative Sample 2 were prepared, similarly to the present invention Sample Nos. 1-4 and comparative Sample 1, except that the following organic semiconductor material is employed in place of the organic semiconductor material used in Sample Nos. 1-4 and comparative Sample 1 in Example 1.

Organic Semiconductor Material;

Prepared is a chloroform solution of a regioregular poly(3-hexylthiophene) (produced by Aldrich Co., Ltd.) which has been purified to have a Zn or Ni content of not more than 10 ppm. After this solution was ejected employing a piezo type ink jet, and a patterning and a drying process at room temperature were carried out, a heat treatment process was conducted in an $N_2$ gas replaced atmosphere at 50° C. for 30 minutes. The thickness of poly(3-hexylthiophene) at the time was 30 nm.

Thin-film transistor Sample Nos. 5-8 of the present invention exhibited good working property as a p-channel enhancement type FET (field-effect transistor). The carrier mobility at saturated region was also measured. The results are shown in the table.

| Sample No. | Silane or titanium compound | Carrier mobility (cm²/Vs) |
|---|---|---|
| Present invention No. 5 | methyl triethoxy silane | 0.031 |
| Present invention No. 6 | hexyl triethoxy silane | 0.037 |
| Present invention No. 7 | trifluoromethylethyl triethoxy silane | 0.043 |
| Present invention No. 8 | methyltriisopropoxy titanium | 0.030 |
| Comparative Sample No. 2 | in the case of not being subjected to atmospheric pressure plasma surface treatment | 0.022 |

Example 3

A substrate before forming a semiconductor layer thereon was prepared as described below.

(Substrate 1)

Similarly to Example 1, after a gate insulating layer (a 200 nm thick silicon oxide layer) was prepared by the atmospheric pressure plasma method, a substrate is exposed to excited discharge gas for 3 seconds to be pretreated by introducing discharge gas ($N_2$:$O_2$=99:1 by volume) into an atmospheric pressure plasma discharge treatment apparatus shown in FIG. 8 before forming thin film 4. Incidentally, a high frequency power supply (frequency: 40 kHz) produced by Haiden Laboratory Inc. was employed, and the discharge output power was set to 10 W/cm². Similarly to Example 1, thin film 4 was subsequently formed.

(Substrates 2-4)

Substrates were prepared, similarly to substrate 1 except that the material of reactive gas used for the atmospheric pressure plasma method was replaced as shown in Table 3.

(Substrate 5: Comparison)

A substrate was prepared, similarly to substrate 1 except that thin film 4 was not formed.

(Substrate 6: Comparison)

A substrate was prepared, similarly to substrate 1 except that thin film 4 was formed as described below.

After immersing a substrate in a 1 mM toluene solution of octadecyltrichloro silane at 40° C. for 60 minutes, the substrate was soaked in toluene for 3 minutes via ultrasonic cleaning, and dried in the air at room temperature.

Pentacene purified via sublimation (produced by Aldrich Co., Ltd.) was evaporated under a vacuum of $3 \times 10^{-4}$ Pa onto the substrate prepared as described above, whereby a 50 nm thick organic semiconductor layer was formed. Similarly to Example 1, source and drain electrodes were further formed to prepare a sample.

The drain current was measured by sweeping the gate bias voltage from +20 V to −70 V when the drain bias voltage of each sample was set to −60 V to measure the carrier mobility at a saturated region, and thus the ratio of maximum and minimum values of the resulting drain current (being an on/off ratio). The results are shown in the following table below.

Example 4

Similarly to Example 2, an organic semiconductor Layer containing a regioregular poly(3-hexylthiophene) was prepared on each substrate prepared under the same conditions as in Example 3. The evaluation was subsequently made, similarly to Example 3. The results are shown in the right-hand column of the table below.

| Substrate No. | Reactive gas | Contact angle (°) | Carrier mobility | on/off ratio | Carrier mobility | on/off ratio |
|---|---|---|---|---|---|---|
| 1 | CH₃Si(OC₂H₅)₃ | 85 | 0.52 | $4.5 \times 10^6$ | 0.042 | $5.2 \times 10^4$ |
| 2 | CH₃(CH₂)₅Si(OC₂H₅)₃ | 93 | 0.67 | $1.3 \times 10^7$ | 0.052 | $8.6 \times 10^4$ |
| 3 | CF₃(CH₂)₂Si(OC₂H₅)₃ | 100 | 0.75 | $2.2 \times 10^7$ | 0.062 | $1.7 \times 10^5$ |
| 4 | CH₃Ti(OC₃H₇)₃ | 86 | 0.51 | $3.8 \times 10^6$ | 0.044 | $4.3 \times 10^4$ |
| 5 | | 7 | 0.12 | $9.2 \times 10^4$ | 0.003 | $3.5 \times 10^3$ |
| 6 | | 78 | 0.37 | $8.7 \times 10^5$ | 0.025 | $1.3 \times 10^4$ |

Example 5

A substrate was prepared similarly to Example 4 except that thin film 4 was changed.

The apparatus in FIG. 9 is employed for forming thin film 4, and materials, gas and output obtained via the atmospheric pressure plasma method are further shown in a figure. Gases A and B were introduced from supply port of gas M and supply port of gas G, respectively. Herein, when thin film 4 was formed on substrate 7, a discharging process was carried out at a frequency of 13.56 MHz employing a high frequency power supply produced by Pearl Kogyo Co., Ltd. When thin film 4 was formed on substrates 8-12, a discharging process was also carried out with a frequency of 50 kHz employing a high frequency power supply produced by Shinko Electric Co., Ltd. The discharging time was set to 5 seconds for both cases.

Results of the samples measured similarly to Example 4 are shown in the following table.

| | Gas A | | | Gas B | | |
|---|---|---|---|---|---|---|
| Substrate No. | Silane compound or titanium compound | | Discharge gas | Reactive gas | Discharge gas | Output power |
| 7 | (CH₃)₂Si(OC₂H₅)₂ | 0.1 vol % | Ar 99.9 vol % | H₂ 1.0 vol % | Ar 99.0 vol % | 3 W/cm² |
| 8 | CF₃(CF₂)₇CH₂CH₂Si(OCH₃)₃ | 0.1 vol % | N₂ 99.9 vol % | H₂ 1.0 vol % | N₂ 99.0 vol % | 5.5 W/cm² |
| 9 | CH₃(CH₂)₁₇SiCl₃ | 0.1 vol % | N₂ 99.9 vol % | H₂ 1.0 vol % | N₂ 99.0 vol % | 5.5 W/cm² |
| 10 | (CH₃)₃SiOSi(CH₃)₃ | 0.1 vol % | Ar 99.9 vol % | H₂ 1.0 vol % | Ar 99.0 vol % | 5.5 W/cm² |
| 11 | (C₆H₅)₂Si(OCH₃)₂ | 0.1 vol % | Ar 99.9 vol % | H₂ 1.0 vol % | Ar 99.0 vol % | 5.5 W/cm² |
| 12 | OPTOOL DSX | 0.1 vol % | N₂ 99.9 vol % | H₂ 1.0 vol % | N₂ 99.0 vol % | 5.5 W/cm² |

| Substrate No. | Contact angle (°) | Carrier mobility | on/off ratio |
|---|---|---|---|
| 7 | 95 | 0.053 | $9.1 \times 10^4$ |
| 8 | 107 | 0.073 | $2.1 \times 10^5$ |
| 9 | 93 | 0.048 | $5.5 \times 10^4$ |
| 10 | 96 | 0.055 | $9.3 \times 10^4$ |
| 11 | 90 | 0.045 | $4.3 \times 10^4$ |
| 12 | 112 | 0.076 | $1.8 \times 10^5$ |

EFFECT OF THE INVENTION

An organic thin-film transistor exhibiting high carrier mobility and a manufacturing method thereof can be provided via the present invention. An organic thin-film transistor capable of providing mass production at low cost, and its method suitable for manufacturing via a non vacuum system roll-to-roll process can also be provided.

What is claimed is:

1. A method for manufacturing an organic thin-film transistor comprising steps of;
    forming a gate electrode and a gate insulating layer on a substrate surface,
    forming a film containing an inorganic compound on the gate insulating layer by a CVD (chemical vapor deposition) method employing a reactive gas, the film having a surface with a contact angle against pure water of not less than 50°, and
    forming an organic semiconductor layer on the film, wherein the reactive gas comprises

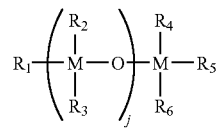

wherein M is Si, Ti, Ge, Zr, or Sn; $R_1$-$R_6$ is each a hydrogen atom or a monovalent group, and at least one group among groups represented by $R_1$-$R_6$ is an organic group with fluorine atom, and j is an integer of 0 to 150.

2. The method for manufacturing the organic thin-film transistor of claim 1,
    wherein the aforesaid CVD method is a plasma CVD method.

3. The method for manufacturing the organic thin-film transistor of claim 2,
    wherein the aforesaid plasma CVD method is an atmospheric pressure plasma method in which discharge-plasma is generated by applying a high frequency voltage between electrodes facing each other at atmospheric pressure or approximately atmospheric pressure.

4. The method for manufacturing the organic thin-film transistor of claim 1,
    wherein the aforesaid gate insulating layer is formed by generating discharge-plasma after a high frequency voltage is applied between electrodes facing each other at atmospheric pressure or approximately atmospheric pressure, and by placing the substrate, on which the gate electrode is formed, in reactive gas excited by the plasma.

5. The method for manufacturing the organic thin-film transistor of claim 1,
    wherein the aforesaid film is formed after the gate insulating layer is placed in the generated discharge-plasma, supplying a discharge gas, by applying a high frequency voltage between electrodes facing each other at atmospheric pressure or approximately atmospheric pressure.

6. The method for manufacturing the organic thin-film transistor of claim 5,
    wherein the aforesaid discharge gas contains oxygen.

7. The method for manufacturing the organic thin-film transistor of claim 1,
    wherein the raw material of the reactive gas for forming a film contains a silicon or fluorine-containing organic compound.

8. The method for manufacturing the organic thin-film transistor of claim 1,
    wherein the raw material of the reactive gas for forming a film contains a silane compound having at least one alkyl group, or a titanium compound having at least one alkyl group.

9. The method for manufacturing the organic thin-film transistor of claim 1,
    wherein a process for forming an organic semiconductor layer comprises a process for volatilizing a solvent in a solution after supplying the semiconducting material solution.

10. The method for manufacturing the organic thin-film transistor of claim 1,
    wherein the semiconductor layer contains a π conjugate polymer or a π conjugate oligomer.

11. The method for manufacturing the organic thin-film transistor of claim 1,
    wherein the substrate is flexible resin sheet.

12. The method for manufacturing the organic thin-film transistor of claim 11,
    wherein the substrate is long length film.

13. The method for manufacturing the organic thin-film transistor of claim 1,
    wherein the substrate has a subbing layer containing a compound selected from inorganic oxides or inorganic nitrides, or a subbing layer containing a polymer.

14. The method for manufacturing the organic thin-film transistor of claim 1,
    wherein the method further comprises a step of forming a subbing layer by atmospheric pressure plasma method before forming the gate electrode and a gate insulating layer.

15. The method for manufacturing the organic thin-film transistor of claim 1,
    wherein the film comprises an organometallic compound.

16. The method for manufacturing the organic thin-film transistor of claim 1, wherein the reactive gas comprises an organosilicon compound or an organometallic compound.

17. The method for manufacturing the organic thin-film transistor of claim 16, wherein the reactive gas comprises an organosilicon compound.

18. The method for manufacturing the organic thin-film transistor of claim 16,
    wherein the reactive gas comprises the organometallic compound and the organometallic compound contains Ti, Ge, Zn, or Sn.

19. The method of claim 1, wherein j is an integer of 0 to 50.

20. The method of claim 1, wherein j is an integer of 0 to 20.

21. The method of claim 1, wherein at least one group among groups represented by $R_1$-$R_6$ is an alkyl, alkenyl or aryl group having a fluorine atom.

22. A method for manufacturing an organic thin-film transistor comprising steps of;
    forming a gate electrode and a gate insulating layer on a substrate surface,
    forming a film on the gate insulating layer by a CVD (chemical vapor deposition) method employing a reactive gas comprising a compound represented by the formula of

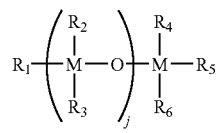

wherein N is Si, Ti, Ge, Zr, or Sn; $R_1$-$R_6$ is each a hydrogen atom or a monovalence group, and at least one group among groups represented by $R_1$-$R_6$ is an organic group with fluorine atom, and j is an integer of 0 to 150, and a discharge gas, the film having a surface with a contact angle against pure water of not less than 50°, and forming an organic semiconductor layer on the film.

23. The method for manufacturing the organic thin-film transistor of claim 22, wherein the discharge gas is excited and the excited gas is brought into contact with the reactive gas to form the film.

* * * * *